United States Patent
Takigawa et al.

(10) Patent No.: US 11,177,625 B2
(45) Date of Patent: Nov. 16, 2021

(54) LASER APPARATUS

(71) Applicant: FANUC CORPORATION, Yamanashi (JP)

(72) Inventors: Hiroshi Takigawa, Yamanashi (JP); Hiroyuki Yoshida, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 42 days.

(21) Appl. No.: 16/835,430

(22) Filed: Mar. 31, 2020

(65) Prior Publication Data

US 2020/0328571 A1 Oct. 15, 2020

(30) Foreign Application Priority Data

Apr. 15, 2019 (JP) .............................. JP2019-076954

(51) Int. Cl.
*H01S 5/024* (2006.01)
*H01S 5/042* (2006.01)

(52) U.S. Cl.
CPC ...... *H01S 5/02423* (2013.01); *H01S 5/02438* (2013.01); *H01S 5/042* (2013.01)

(58) Field of Classification Search
CPC ............. H01S 5/02438; H01S 5/06216; H01S 5/02423; H01S 5/0021; H01S 5/0617; H01S 5/042
USPC .......................................................... 372/34
See application file for complete search history.

(56) References Cited

U.S. PATENT DOCUMENTS

| 8,023,542 B2 * | 9/2011 | Vetrovec ................. H01S 3/042 372/35 |
| 2004/0095974 A1 * | 5/2004 | Gibson ................. F25B 25/005 372/35 |
| 2017/0237231 A1 * | 8/2017 | Guinn ..................... F28F 3/086 372/35 |

FOREIGN PATENT DOCUMENTS

| JP | H07-260285 A | 10/1995 |
| JP | 2001-082632 A | 3/2001 |
| JP | 2004-092779 A | 3/2004 |
| JP | 2004-128062 A | 4/2004 |
| JP | 2005-159024 A | 6/2005 |

(Continued)

OTHER PUBLICATIONS

An Office Action mailed by the Japan Patent Office dated Oct. 5, 2021, which corresponds to Japanese Patent Application No. 2019-076954 and is related to U.S. Appl. No. 16/835,430; with English translation.

*Primary Examiner* — Tuan N Nguyen
(74) *Attorney, Agent, or Firm* — Studebaker & Brackett PC

(57) ABSTRACT

A laser apparatus comprising a laser diode module/cooling plate assembly in which a plurality of LD modules to which a driving current is supplied in series is disposed on the surface of a cooling plate, comprising: a laser power source; switch valves for switching a flow direction of a cooling liquid flowing through a cooling liquid flow path; a timing determination apparatus for determining the timing for switching the flow direction of the cooling liquid, by referencing temperature time series data of at least any one temperature variation part in the laser diode module/cooling plate assembly having temperature variations due to heat generated in a heat-generating part of the laser diode module; and a control circuit for outputting a driving current output command to the laser power source and outputting a (Continued)

valve switch command to the switch valves by referencing the determination result of the timing determination apparatus.

15 Claims, 18 Drawing Sheets

(56) References Cited

FOREIGN PATENT DOCUMENTS

| | | | |
|---|---|---|---|
| JP | 2014077185 A | 5/2014 |
| JP | 2016-054279 A | 4/2016 |
| JP | 2016-528460 A | 9/2016 |
| JP | 2017212851 A | 11/2017 |
| JP | 2019016757 A | 1/2019 |
| JP | 2019-031200 A | 2/2019 |

\* cited by examiner

LASER APPARATUS

This application is based on and claims the benefit of priority from Japanese Patent Application No. 2019-076954, filed on 15 Apr. 2019, the content of which is incorporated herein by reference.

BACKGROUND OF THE INVENTION

Field of the Invention

The present invention relates to a laser apparatus in which a plurality of laser diode modules (hereinafter, called LD modules) used as a laser light source or an excitation light source of the laser apparatus are cooled by disposing the plurality of laser diode modules on the surface of a cooling plate which is cooled by circulating a cooling liquid therethrough.

Related Art

In the recent high power laser apparatuses for laser processing, providing higher power for such apparatuses has been increasingly advanced with the aim of expanding the range (of the thickness, materials and the like, for example) for a processable workpiece (a work), facilitating the processing speed, etc. In particular, the trend toward a higher power laser apparatus is remarkable in which an LD module comprising at least one laser diode (hereinafter, called an LD) is used as a laser light source or an excitation light source for the laser apparatus. In order to provide higher power for the laser apparatus in which a plurality of LD modules is used as a laser light source or an excitation light source, increasing the number of LD modules used is required along with providing higher optical output for each LD module.

Since the amount of heat generated increases with the provision of the higher output for the LD module and the increasing number of the LD modules, in many cases, the plurality of LD modules is disposed on the surface of a cooling plate which is cooled by flowing a cooling liquid therein in order to suppress the rise in temperature of the LD modules. In addition, a cooling liquid flow path 3 for flowing the cooling liquid therein which is represented by a dashed line as shown in FIG. 1 is laid within the cooling plate 2 or on its surface in order to cool the cooling plate by circulating the cooling liquid. It is common for the cooling liquid flow path 3 in the immediate vicinity of each LD module 1 to have a cooling structure through which the cooling liquid circulates in series.

Meanwhile, in FIG. 1, a broken line arrow shows the flow direction of the cooling liquid. Further, the reason why a part of the LD module 1 is formed by a convex shape is that, in many cases, the laser light emitted from the plurality of LDs within the LD module 1 is focused on a lens or a mirror, enters an end of an optical fiber, propagates across the optical fiber and is externally extracted as laser light, and therefore a structure in which the optical fiber protrudes from the convex-shaped tip of the LD module 1 is schematically shown. Additionally, the reason why the LD module 1 is arranged in a longitudinally tilted position from the cooling liquid flow path 3 is that the optical fiber protruding from the convex-shaped tip of the LD module 1 is prevented from interfering with the adjacent LD modules 1. The cooling liquid flows from a cooling liquid supply apparatus and the like into the cooling liquid flow path 3 of the cooling plate 2 via a cooling liquid pipe 4.

As shown in FIG. 1, an assembly in which the plurality of LD modules is arranged on the surface of the cooling plate is herein referred to as an LD module/cooling plate assembly. In an LD module/cooling plate assembly 5 as shown in FIG. 1, the temperature of the cooling liquid increasingly rises due to the absorption of heat generated in the plurality of LD modules 1. Because of this, a problem arises that the temperature of the LD module 1 disposed in a position close to the downstream side of the cooling liquid flow path 3 tends to be higher as compared to that of the LD module 1 disposed in a position close to the upstream side of the cooling liquid flow path 3 when the cooling liquid circulates.

Assuming that thermal resistance from the cooling liquid to a heat-generating part of each LD module, namely the p-n junction of the LD is the same, the temperature of the heat-generating part of the LD module increases by the amount of rise in temperature of the cooling liquid flowing through the immediately close cooling liquid flow path. With the rise in temperature of the heat-generating part of the LD module, the life consumption load of the LD module increases accordingly, thereby resulting in shortening life of the LD module or rising the average failure rate. This is not so problematic as long as the total amount of heat generated in the plurality of LD modules is not too big. However, this has increasingly become a non-negligible problem, because the amount of heat generated increases with the provision of the higher output for the LD module and the increasing number of the LD modules, as described above. Meanwhile, in order to prevent complicated wiring for supplying the driving current to the plurality of LD modules and to avoid an increase in the driving current, the driving current is usually supplied to the plurality of LD modules in series. Because of this, to make the temperature of the LD module uniform by varying the driving current in each LD module is not realistic.

For example, assuming that the electricity-to-light conversion efficiency of the LD module is 60%, in order to obtain the total optical output of 5 kW using the plurality of LD modules, the total amount of heat generated in the plurality of LD modules comes to about 3.33 kW. For this reason, assuming that the cooling liquid is chilled water and the flow rate is 10 L/min (=$1.67 \times 10^{-4}$ m$^3$/s), the rise in temperature of the cooling liquid comes to: the total amount of heat generated/(the flow rate×the specific heat of water×the density of water)=$3.33 \times 10^3$(W)/($1.67 \times 10^{-4}$(m$^3$/s)× $4.183 \times 10^3$(J/(kg·K))×$9.982 \times 10^2$(kg/m$^3$))=4.8(K).

Needless to say, when heat generated in other heat-generating sources such as, for example, an amplifying optical fiber in a fiber laser is also radiated by the same cooling plate, the rise in temperature of the cooling liquid is further increased in dependence on the amount of heat generated in the other heat-generating sources. In order to estimate how the life and the average failure rate vary by the temperature difference of 4.8 K, assuming that the temperature of the heat-generating part of the LD module disposed in a position close to the upstream side of the cooling liquid flow path is 50° C. when the cooling liquid circulates, and assuming that, as is commonly said, the life drops to 50% with a 10° C. rise in temperature, the life of the LD module disposed in the position close to the downstream side of the cooling liquid flow path reduces to as low as 71% of the LD modules disposed in a position close to the upstream side of the cooling liquid flow path, due to the 4.8 K rise. The average failure rate grows as high as 1.4 times inversely. In other words, in the case where an LD module unit in which a plurality of LD modules is disposed on the surface of one cooling plate is defined as an exchange unit, the life of the whole LD module unit will be determined by the life of the LD module having the shortest life. Therefore, the problem is that the life of the LD module unit is shortened by the amount of temperature rise in the cooling liquid mentioned above.

As a technique for solving or mitigating this problem, a cooling structure described in Patent Document 1 as shown in FIG. 2 is known, for example. In Patent Document 1, a cooling liquid flow path 3 immediately close to each LD module 1 is described as a cooling unit flow path. In this cooling structure, chilled water circulates through the cooling unit flow path in parallel, instead of in series. This cooling structure has, in order to realize the necessary cooling performance, a structure that meets at least one condition of: a condition that the flow path height of the cooling unit flow path is ½₀ or less of the flow path length and of the flew path width; and a condition that the flow path height is 0.5 mm or less, and has the pressure loss due to pipe friction of the cooling medium which circulates through the cooling unit flow path being larger than that of the cooling medium which circulates through the common supply flow path and the common discharge flow path.

Also in FIG. 2, the cooling liquid flow path 3 is shown by a broken line and the flow direction of the cooling liquid is shown by a broken line arrow, as in FIG. 1. The cooling unit flow path is such that the rectangle cooling liquid flow path 3 immediately below each LD module 1 meets at least one condition of: a condition that the flow path height is ½₀ or less of the flow path length and of the flow path width; and a condition that the flow path height is 0.5 mm or less. As in FIG. 2, when the cooling liquid circulates through the cooling liquid flow path 3 in the vicinity of each LD module 1 in parallel, the most excellent cooling performance is realizable because there is no concept of upstream and downstream, and the problem of the temperature difference between the LD modules 1, 1 is solved fundamentally. However, since this makes the structure of the flow path complicated and the shape of the flow path requires more severe precision, there has been room for improvement in terms of slight increase in the manufacturing cost of the cooling plate 2. As the reason why the shape of the flow path requires more exacting precision, it includes a point that when there is a difference in pressure loss between the flow paths through which the cooling liquid circulates in parallel, the nonuniform flow rate of the cooling liquid flowing through the respective flow paths is resulted, and a point that, due to the extraordinary reduction in the flow rate of the cooling liquid flowing through the respective flow paths, the LD module 1 is not cooled efficiently unless the flow path is significantly narrowed to increase the flow rate. Because of this, it is necessary to fabricate a quite narrow flow path with great precision.

In addition, as another method, increasing the flow rate by the use of a cooling liquid supply apparatus having a great cooling liquid supply capacity, for example, a circular cooling liquid supply apparatus (a chiller), is conceivable. For example, when the flow rate of the cooling liquid is increased double, the rise in temperature of the cooling liquid described above can be reduced by half. However, naturally, such a chiller having a large maximum flow rate is expensive accordingly, and again, an increase in cost is problematic. Further, when the cross-sectional area of the flow path is expanded in order to increase the flow rate of the cooling liquid double, there is a problem that the need for increasing the thickness of the cooling plate arises. On the other hand, in the case where the cross-sectional area of the flow paths is made uniform, the pressure loss in the flow paths will quadruple when the flow rate of the cooling liquid is increased double. In this case, the chiller requires the use of a cooling liquid delivery pump having a high discharge pressure. If the cooling liquid delivery pump having a high discharge pressure is used, requirements on pipe parts such as cooling liquid pipe, a pipe joint and an electromagnetic valve will be more stringent, and the risk of a leak of the cooling liquid will become high.

In addition, as another method, a compromise between the above-mentioned two methods is also conceivable. In other words, the cooling structure is such that the plurality of LD modules 1 is divided into, for example, two groups, the cooling liquid pipe 4 is also branched into two in parallel, and the plurality of LD modules 1 in each group is cooled in series with the cooling liquid which circulates through the branched respective cooling liquid pipe 4, as shown in FIG. 3. Also, in FIG. 3, a dashed line shows the cooling liquid path 3 and a dashed line arrow shows the flow direction of the cooling liquid. If each branched cooling liquid pipe 4 is configured to circulate the same amount of flow rate as that of the case where all the LD modules 1 are cooled in series, although the issue of the need for the double flow as a whole is the same as the above-described method, the problem that the pressure loss is increased by the increase in flow velocity will be eliminated. However, in order to circulate chilled water through each branched cooling liquid pipe 4 in the same flow rate reliably, it will be necessary to provide a structure for increasing the pressure loss in each branched cooling liquid pipe 4 purposefully, a mechanism for feeding back the measured result of the flow rate of the cooling liquid flowing through each cooling liquid pipe 4 to control the flow rate control valves so as to make the flow rate of the cooling liquid flowing through each cooling liquid pipe 4 uniform, or the like. In other words, while this compromise solves some of the respective issues of the above methods, this conversely results in sharing some of the respective issues of above two methods.

As a method for mitigating nonuniformity in the life consumption load between LD modules without virtually increasing the manufacturing cost as compared with the prior art as mentioned above, the following method is conceivable. More specifically, such a method is, in a cooling plate structure in which the cooling liquid circulates through the cooling liquid flow path immediately close to each LD module in series, as in the cooling structure shown in FIG. 1, to mitigate the difference of the life load between the LD module arranged in the upstream side and the LD module arranged in the downstream side when the cooling liquid circulates from one direction by switching the flow direction of the cooling liquid. However, in this case, if the timing for switching the flow direction of the cooling liquid is inappropriate, the effect of mitigating the difference of the life load between the LD modules will be decreased.

As for cooling of the plurality of LD modules, no laser apparatus in which the flow direction of the cooling liquid is switched is found. Patent Document 2 discloses a cooling apparatus comprising: a circular cooling flow path through which a cooling medium for cooling a plurality of objects to be cooled circulates; a heat radiation unit for cooling the cooling medium by heat radiation, which is arranged in the cooling flow path; a pump for transferring the cooling medium to the plurality of objects to be cooled, which is arranged in the cooling flow path; a transfer direction switch mechanism which is capable of switching the transfer direction of the cooling medium transferred to the plurality of objects to be cooled to either a forward direction or an opposite direction which is opposite to the forward direction; and a control unit for controlling the transfer direction switch mechanism. However, as for the timing for switching the flow direction of the cooling liquid, it is determined based on the magnitude relationship between the respective temperatures of the plurality of objects to be cooled and between values indicating the loading condition. Therefore, if this timing is applied to cooling of the plurality of LD modules as in the present application, the flow direction of the cooling liquid will be frequently switched even during driving of the LD modules so as not to widen the difference in temperature and loading condition of the plurality of LD modules. Frequently switching the flow direction of the cooling liquid causes the temperature of the LD modules to be unstable, and causes a rapid wear failure of the switch mechanism, and therefore, this timing is definitely not a switch timing which is applicable to cooling of the plurality of LD modules as in the present application. If a determination condition is set to permit the state in which there is a difference in temperature and load condition between the plurality of LD modules in order not to frequently switch the flow direction of the cooling liquid even during driving of the LD modules, the difference will be fixed, thereby resulting in reducing or almost eliminating the effect of mitigating the difference in life load between LD modules.

Further, Patent Document 3 discloses a PVD treatment method and a PVD treatment device characterized in that the PVD treatment device comprises: a vacuum chamber internally maintained under vacuum, and a positive electrode and a negative electrode disposed within the vacuum chamber, wherein when performing a PVD treatment by producing arc discharges between the positive electrode and the negative electrode to vaporize the negative electrode, a cooling channel for cooling the electrodes by circulating a cooling medium therethrough is provided in at least either of the positive electrode or the negative electrode, and while the circulation direction of the cooling medium in the cooling channel provided in the electrode is alternately reversed from one to the other, and vice versa, the electrode is cooled to perform the PVD treatment. However, for the timing of switching the circulation direction of the cooling medium, it only refers to a method for alternately switching the circulation direction for each batch treatment of the PVD treatment, and a method for alternately switching the circulation direction of the cooling medium in the cooling channel for each divided period by dividing the service life of the negative electrode into a plurality of periods. As in the present application, regarding the plurality of LD modules used as a laser light source or an excitation light source of a laser apparatus, as described below, the transient temperature change of LD modules which affect the life often cannot be disregarded, and further, the LD module may not be constantly driven in the same driving condition and is also often driven in a condition where the driving current and the temperature of the LD module are different or varying. Because of this, with the method for alternately switching the circulation direction of the cooling medium each time a predetermined time or predetermined driving time elapses, there is a problem that the effect of mitigating the difference in life load between LD modules is small.

Patent Document 1: Japanese Unexamined Patent Application, Publication No. 2019-16757

Patent Document 2: Japanese Unexamined Patent Application, Publication No. 2017-212851

Patent Document 3: Japanese Unexamined Patent Application, Publication No. 2014-77185

SUMMARY OF THE INVENTION

As described above, in a high power laser apparatus comprising a plurality of LD modules as a laser light source or an excitation light source, the rise in temperature of the LD module due to heat generated in the LD module is suppressed by disposing the plurality of LD modules on the surface of a cooling plate on which a pipe is provided for circulating a cooling liquid. However, since the temperature of the cooling liquid itself rises by absorbing heat generated in the LD module, when the cooling liquid circulates through a cooling liquid flow path, the temperature of the LD module arranged in the vicinity of the downstream side pipe is increased, as compared with the LD module arranged in the vicinity of the upstream side pipe. For this reason, the life of the LD module arranged in the vicinity of the downstream side pipe is shortened, or its average failure rate is increased, as compared with the LD module arranged in the vicinity of the upstream side pipe. A problem thereby arises that the life and the reliability of the whole of the plurality of LD modules are limited by the life and the reliability of the LD module arranged in the vicinity of the downstream side pipe.

The above-described technique for circulating the cooling liquid in parallel through the cooling liquid flow path in the vicinity of each LD module eliminates a concept of the upstream side and the downstream side, and is an ideal solution in principle. However, in practice, if the cooling liquid having the same flow rate flows through the cooling liquid flow path in the vicinity of each LD module, and if the realization of cooling performance is sought with a cooling liquid flow rate equivalent to or more than the cooling performance where the cooling liquid flows through the cooling liquid flow path in the vicinity of each LD module in series, the structure of the flow path becomes complicated and the shape of the flow path requires more exacting precision. Because of this, there has been room for improvement in terms of slight increase in the manufacturing cost of the cooling plate. In addition, as another method, a method for increasing the flow rate of the cooling liquid is not enough as a desirable solution because this increases the cost including the cooling liquid supply apparatus.

As a method for reducing the difference of the life and the reliability between the plurality of LD modules without hardly increasing the cost, a method for switching the flow direction of the cooling liquid is conceivable. However, in this method, if the timing for switching the flow direction of the cooling liquid is inappropriate, the effect of mitigating the difference of the life load between the LD modules will be decreased. In the case where the above-described prior art for switching the flow direction of the cooling liquid is applied to the laser apparatus comprising a plurality of LD modules, there are problems that switching of the flow direction of the cooling liquid is performed frequently even during driving of the LD modules, and the effect of mitigating the difference of the life load between the LD modules is small due to inability to handle various changes in the driving conditions of the LD module.

Therefore, in the field of the laser apparatus comprising the plurality of LD modules, there is a challenge to make it possible to reduce the difference of the life load between the LD modules effectively without hardly increasing the cost, and even when the driving condition of the LD module changes differently. More specifically, in the field of the laser apparatus comprising the plurality of LD modules, providing a laser apparatus is anticipated, which can reduce the difference of the life load between the LD modules effectively even when the driving condition of the LD module changes differently, by switching the flow direction of the cooling liquid for cooling the plurality of LD modules with an appropriate timing.

A laser apparatus according to one embodiment of the present disclosure is a laser apparatus (for example, a laser apparatus 6, 6A-6F described later) comprising an LD module/cooling plate assembly (for example, an LD module/cooling plate assembly 5 described later) in which a plurality of LD modules (for example, LD modules 1 described later) to which a driving current is supplied in series is disposed on the surface of a cooling plate (for example, a cooling plate 2 described later) which is cooled by flowing a cooling liquid supplied from a cooling liquid supply apparatus (for example, a cooling liquid supply apparatus 7 described later) through a cooling liquid flow path (for example, a cooling liquid flow path 3 described later) formed therein, with the plurality of LD modules thermally connected to the cooling plate, comprising: a laser power source (for example, a laser power source 8 described later) for supplying the driving current to the plurality of LD modules; switch valves (for example, switch valves 9a-9d, 23a, 23b, 27 described later) for switching the flow direction of the cooling liquid flowing through the cooling liquid flow path, which are provided in a cooling liquid pipe (for example, a cooling liquid pipe 4 described later) connecting to the cooling liquid flow path; a timing determination apparatus (for example, a timing determination apparatus 10 described later) for determining the timing for switching the flow direction of the cooling liquid flowing through the cooling liquid flow path, by referencing temperature time series data of at least any one temperature variation part in the laser diode module/cooling plate assembly having temperature variations due to heat generated in a heat-generating part of the LD module composing the plurality of LD modules; and a control circuit (for example, a control circuit 11 described later) for outputting a driving current output command to the laser power source and outputting a valve switch command to the switch valves to switch the flow direction of the cooling liquid flowing through the cooling liquid flow path by referencing the determination result of the timing determination apparatus.

As it takes time for the temperature of the LD module to reach a thermal equilibrium state, not only when the temperature of the cooling liquid supplied from the cooling liquid supply apparatus has been changed, but also when the temperature of the cooling liquid supplied from the cooling liquid supply apparatus is stable, the temperature of the LD module changes during driving of the LD module and affects the life of the LD module. Therefore, according to the above configuration, by determining the timing for switching the flow direction of the cooling liquid by referencing temperature time series data of the temperature variation part whose temperature varies depending on the temperature change in the LD module, switching of the flow direction of the cooling liquid is allowed with the timing for allowing effective reduction of the difference of the life load between the LD modules, and the longer life can be encouraged across the whole of the LD modules.

In another aspect of the laser apparatus, the timing determination apparatus comprises: a first record unit (for example, a first record unit 20 described later) for recording at least one acceleration factor data of first acceleration factor data which is an acceleration factor which depends on the optical output and the temperature of the temperature variation part of the LD module and second acceleration factor data which is an acceleration factor which depends on the driving current and the temperature of the temperature variation part of the laser diode module, the acceleration factors, on the basis of the life consumption speed when the LD module is driven in a standard driving condition, being a life consumption acceleration factor which represents the ratio of the life consumption speed when the LD module is driven in a driving condition which is different from the standard driving condition; a computation circuit (for example, a computation circuit 21 described later) for computing effective cumulative driving time by referencing at least one time series data of optical output time series data of LD module and the driving current time series data of the LD module in addition to the temperature time series data of the temperature variation part, and performing time integral of the acceleration factor read from the first record unit, from the first driving start point of the laser diode module to the latest point; and a second record unit (for example, a second record unit 22 described later) for recording the computed effective cumulative driving time about at least one LD module among the plurality of LD modules, and the timing determination apparatus may be configured to determine the timing for switching the flow direction of the cooling liquid based on the effective cumulative driving time recorded in the second record unit.

According to the above configuration, even when it is necessary to drive the laser apparatus in a condition where the optical output and the driving current are changed, instead of the driving condition of controlling on-off only with the rating optical output and the rating driving current, the timing determination apparatus determines the timing for switching the flow direction of the cooling liquid based on the calculated effective cumulative driving time of the LD module by taking the change in the life consumption speed due to the magnitude of the optical output and the driving current into account. This allows the difference of the effective cumulative driving time, that is to say, the difference of the life consumption between the plurality of LD modules to be reduced, and the variations in the end-of-life timing between the plurality of LD modules can be reduced.

In another aspect of the laser apparatus, at least one of the temperature variation parts is a p-n junction of an LD which is a heat-generating part of at least one LD module of the plurality of LD modules, at least one of the temperature time series data is the temperature time series data of the p-n junction of the LD, at least one acceleration factor data of the first acceleration factor data and the second acceleration factor data recorded in the first record unit is respectively recorded as, optical output acceleration factor data which is an optical output acceleration factor with respect to the standard optical output of the LD module, and temperature acceleration factor data which is a temperature acceleration factor of the heat-generating part of the LD module, and current acceleration factor data which is a driving current acceleration factor with respect to the standard driving current of the LD module and the temperature acceleration factor data which is a temperature acceleration factor of the heat-generating part of the LD module, and the computation circuit may compute the effective cumulative driving time by performing time integral of the product of the optical output acceleration factor and the temperature acceleration factor or of the product of the current acceleration factor and the temperature acceleration factor, from the first driving start point of the LD module to the latest point.

According to the above configuration, when dependency of the LD's life degradation speed on the temperature is defined as dependency of the LD's life degradation speed on the p-n. junction of the LD's temperature, the impact of the temperature change at the p-n junction of the LD on the life consumption speed which is accompanied by the change in the optical output and the driving current can be incorporated so that the optical output or driving current acceleration factor, and the temperature acceleration factor can be separated. By separating the optical output or driving current acceleration factor, and the temperature acceleration factor, the amount of acceleration factor data necessary to be obtained by experiments or the like, and recorded by the first record unit can be greatly reduced and the man-hour count can be saved, in comparison to the case where the acceleration factor data is recorded as a two-dimensional data table in which the optical output and the temperature are defined as variables, or a two-dimensional data table in which the driving current and the temperature are defined as variables.

In another aspect of the laser apparatus, at least one acceleration factor data of the temperature acceleration factor data, the optical output acceleration factor data and the current acceleration factor data which are recorded in the first record unit may be recorded in a mathematical equation format for calculating an acceleration factor, instead of the numerical data which directly represents the acceleration factor.

According to the above configuration, the acceleration factor data is recorded as the mathematical equation format data, instead of the numerical data, thereby allowing calculation of the effective cumulative driving time with less data, and further reduction in the man-hours spent for data acquisition.

In another aspect of the user apparatus, at least one acceleration factor data of the optical output acceleration factor data and the current acceleration factor data may be recorded in the first record unit as data dependent on the effective cumulative driving time.

According to the foregoing configuration, even when the optical output acceleration factor and the current acceleration factor tend to gradually increase when the LD module reaches the later life in a condition where the optical output is greater than the standard optical output, namely, the optical output acceleration factor>1, or in a condition where the driving current is greater than the standard driving current, namely the current acceleration factor>1, the calculation of the effective cumulative driving time is allowed with greater precision.

In another aspect of the laser apparatus, the optical output acceleration factor data or the current acceleration factor which depends on the effective cumulative driving time may respectively be optical output acceleration factor data or current acceleration factor data which is determined by an acceleration factor deriving apparatus or an acceleration factor deriving method for deriving the optical output acceleration factor or the current acceleration factor which depends on the effective cumulative driving time by driving the LD module with a certain optical output different from the standard optical output included in the standard driving condition only for a predetermined certain period in the whole life of the LD module, or by driving the LD module with a certain driving current different from the standard driving current included in the standard driving condition only for a predetermined certain period in the whole life of the LD module.

According to the foregoing configuration, dependency of the optical output acceleration factor or the current acceleration factor on the effective cumulative driving time can be derived more rationally and relatively easily, and the effective cumulative driving time can be calculated more accurately.

In another aspect of the laser apparatus, the timing determination apparatus may determine, as the timing for switching the flow direction of the cooling liquid, a point when a first time difference which is the time difference between a first effective cumulative driving time which is the effective cumulative driving time of a first LD module (for example, a first LD module 24 described later) of the plurality of the LD modules and a second effective cumulative driving time which is the effective cumulative driving time of a second LD module (for example, a second LD module 25 described later) of the plurality of the LD modules, exceeds a first setting time.

According to the above configuration, the widening difference of the effective cumulative driving time between LD modules which have a different disposed position can be directly prevented, and the variations in the end-of-life timing between the LD modules can be reliably reduced.

In another aspect of the laser apparatus, the first setting time is a first function in which any of the first effective cumulative driving time, the second effective cumulative driving time, and the sum of the first effective cumulative driving time and the second effective cumulative driving time is defined as a first variable, and the first function may be a function that the first variable is in a positive range and is a weakly monotonically decreasing function, and its minimum value is defined as a positive first constant.

According to the above-mentioned configuration, for a period of the small effective cumulative driving time during which it is not necessary to frequently switch the flow direction of the cooling liquid, wear in the switch valves and the like can be reduced by not switching the flow direction of the cooling liquid frequently. Further, switching of the flow direction of the cooling liquid can be set so that the flow direction of the cooling liquid is not switched as frequently as the positive first constant time even when the effective cumulative driving time becomes longer and the LD module reaches the end of its life.

In another aspect of the laser apparatus, assuming that among the plurality of the LD modules, an LD module having the least temperature change at the heat-generating part of the LD module or a predetermined position of the LD module thermally connected to the heat-generating part is defined as a third LD module (for example, a third LD module 26 described later), providing when the flow direction of the cooling liquid is switched, the driving current is unchanged, the timing determination apparatus may determine, as the timing for switching the flow direction of the cooling liquid, a point when a second time difference which is the time difference between a third effective cumulative driving time which is the latest effective cumulative driving time of the third LD module and the effective cumulative driving time of the third LD module at the last point when the flow direction of the cooling liquid was switched, exceeds a second setting time.

According to the above-mentioned configuration, the only LD module for which the effective cumulative driving time is calculated is the third LD module, and calculation load in the calculation circuit can be reduced.

According to another aspect of the laser apparatus, the second setting time is a second function that the third effective cumulative driving time is defined as a second variable, and the second function may be a function that the second variable is in a positive range and is a weakly monotonically decreasing function, and its minimum value is defined as a positive second constant.

According to the above configuration, for a period of the small effective cumulative driving time during which it is not necessary to frequently switch the flow direction of the cooling liquid, wear in the switch valves and the like can be reduced by not switching the flow direction of the cooling liquid frequently. Further, switching of the flow direction of the cooling liquid can be set so as not to be switched as frequently as the positive second constant time even when the effective cumulative driving time becomes longer and the LD module reaches the end of its life.

According to another aspect of the laser apparatus, the laser apparatus measures, by a command from the control circuit, the optical output property of the laser oscillator in which the plurality of LD modules is used as a light emitting source or an excitation light source in a predetermined driving condition and along a predetermined schedule, and comprises a third record unit (for example, a third record unit 29 described later) which associates the history of the measured result for the optical output property with the effective cumulative driving time which is recorded in the first record unit and records it, and the control circuit may, by using the measured result for the optical output property associated with the effective cumulative driving time which is recorded in the third record unit, output at least any one of: dependency of an actual optical output or an actual driving current on the effective cumulative driving time; the degradation width or the degradation rate of the actual optical output or the actual driving current between a certain optical output property measured point and the previous optical output property measured point; and the degradation speed in which the degradation width is divided by the difference of the effective cumulative driving time between the both points, the actual optical output being an optical output outputted by a predetermined driving current derived from the optical output property, and the actual driving current being a driving current necessary to obtain a predetermined optical output.

According to the above configuration, the degradation status and the remaining life of the plurality of the LD modules can be grasped as a whole, and preparation for an LD module unit for replacement and maintenance operation can be systematically performed, and therefore the downtime of the laser apparatus can be minimized.

In another aspect of the laser apparatus, the laser apparatus is a laser apparatus (for example, a laser apparatus 6F described later) in which LD module groups (for example, a plurality of LD module groups 100 described later) composed of a plurality of LD modules to which the driving current is supplied in series is present, and the driving current can be supplied to each LD module group independently, and the control circuit, in order to output a predetermined optical output command, may output a driving current outputting command so that the driving current is allocated preferentially to an LD module group having the relatively shorter effective cumulative driving time or an LD module group having the relatively smaller deterioration speed among the plurality of LD module groups when the driving current outputting command for each LD module group is outputted to the laser power source.

According to the above-mentioned configuration, with respect to a predetermined optical output command, life consumption for the LD module group having the relatively longer effective cumulative driving time or the LD module group having the relatively larger characteristic deterioration can be suppressed by preferentially allocating the driving current to the LD module group having the relatively shorter effective cumulative driving time or the LD module group having the relatively smaller characteristic deterioration among the LD module groups. This can reduce the count of maintenance and the maintenance cost of the laser apparatus because replacement time for each LD module group can be made uniform.

In another aspect of the laser apparatus, the control circuit may be configured to output at least any one of: the effective cumulative driving time; dependency of the actual optical output or the actual driving current on the effective cumulative driving time; and the deterioration rate via a network (for example, a network 200 described later) to a cloud server (for example, a cloud server 201 described later) or a fog server (for example, a fog server 202 described later).

According to the above-mentioned configuration, in each LD module group in which the supply of the driving current is independently controllable, the driving status, the deterioration status and the remaining life can be collectively managed by the cloud server or the fog server, and therefore designed maintenance is allowed and the downtime of the laser apparatus due to the replacement and maintenance operation of the LD module can be reduced.

In another aspect of the laser apparatus, the switch valves may composed of three-way valves produced by a set of two: one inlet-side three-way valve (for example, a switch valve 23a described later) in which three cooling liquid pipes (for example, cooling liquid pipes 42a, 42b, 42f described later) for flowing the cooling liquid supplied from the cooling liquid supply apparatus to the cooling liquid flow path are connected; and one outlet-side three-way valve (for example, a switch valve 23b described later) in which three cooling liquid pipes (for example, cooling liquid pipes 42c, 42d, 42e described later) for flowing the cooling liquid flowed out of the cooling liquid flow path are connected.

According to the above-mentioned configuration, while the number of the pipe members is reduced, the rise in temperature of the inlet-side cooling liquid due to heat exchange between the inlet-side cooling liquid and the outlet-side cooling liquid resulting from heat conduction via the switch valves can be suppressed more than the case in which the two-way valve only having an opening arid closing function is used.

In another aspect of the laser apparatus, the switch valve is a four-way valve (for example, a switch valve 27 described later) in which four cooling liquid pipes are connected, and at least main part of the four-way valve is made of a fluoride resin, and the flow direction of the cooling liquid flowing through the cooling liquid flow path may be changed by the four-way valve.

According to the above configuration, the number of the pipe members can be reduced, and it is advantageous for downsizing, cost reduction and enhancement of reliability. In addition, when the material of the main portion of the four-way valve is made of the fluoride resin such as Polychlorotrifluoroethylene which has a low heat conductivity and a high mechanical strength, the rise in temperature of the inlet-side cooling liquid due to heat exchange between the inlet-side cooling liquid and the outlet-side cooling liquid can be suppressed, although this results in the inlet-side cooling liquid and the outlet-side cooling liquid flowing through the same four-way valve.

According to one aspect of the laser apparatus, the difference of the life load between the LD modules can be effectively reduced by switching the flow direction of the cooling liquid for cooling the plurality of LD modules with an appropriate timing even when the driving condition of the LD module changes differently.

DETAILED DESCRIPTION OF THE INVENTION

Figure 1:
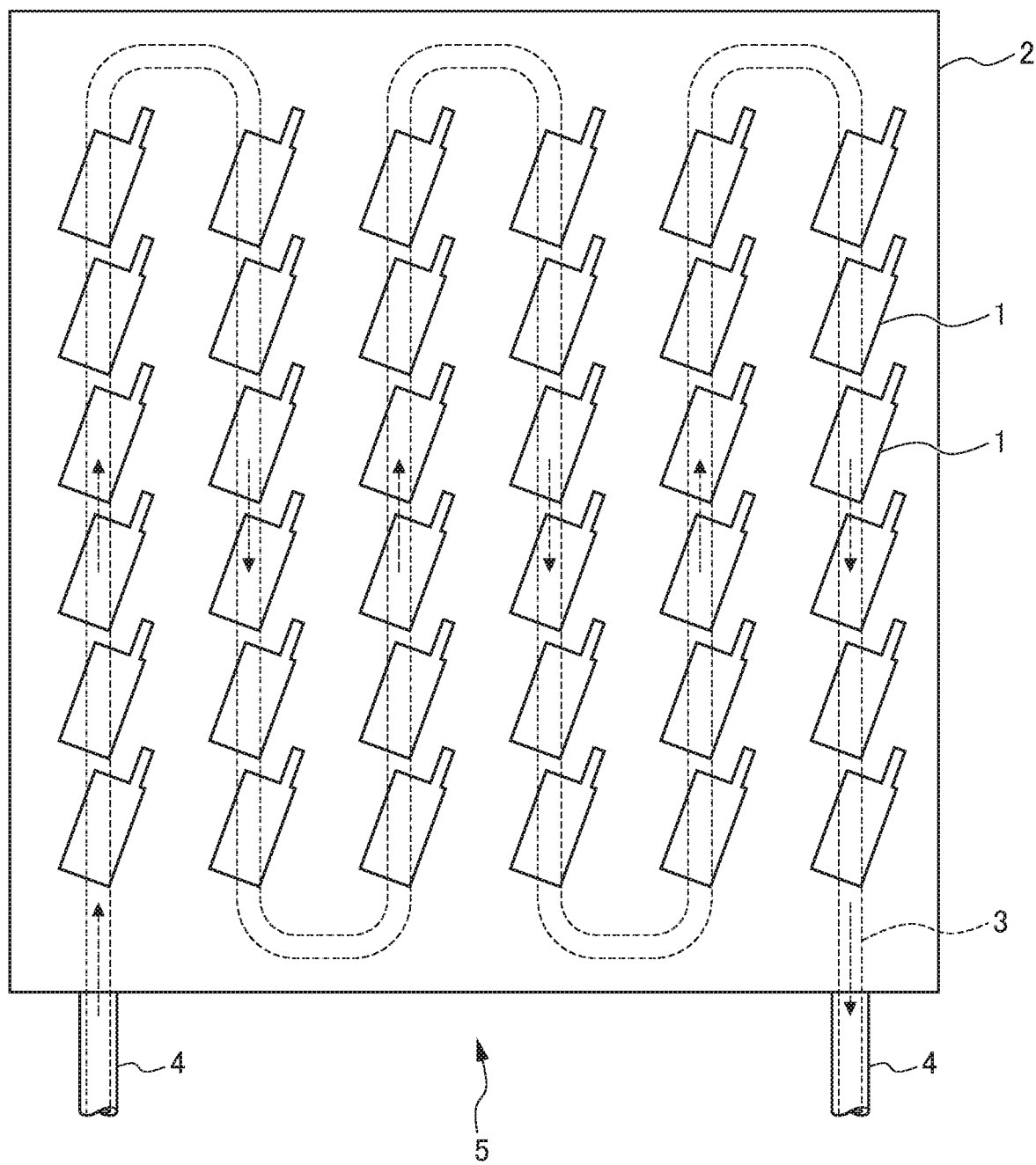
FIG. 1 is a plan view schematically illustrating a plurality of LD modules and a conventional cooling structure for cooling the plurality of LD modules.
Figure 2:
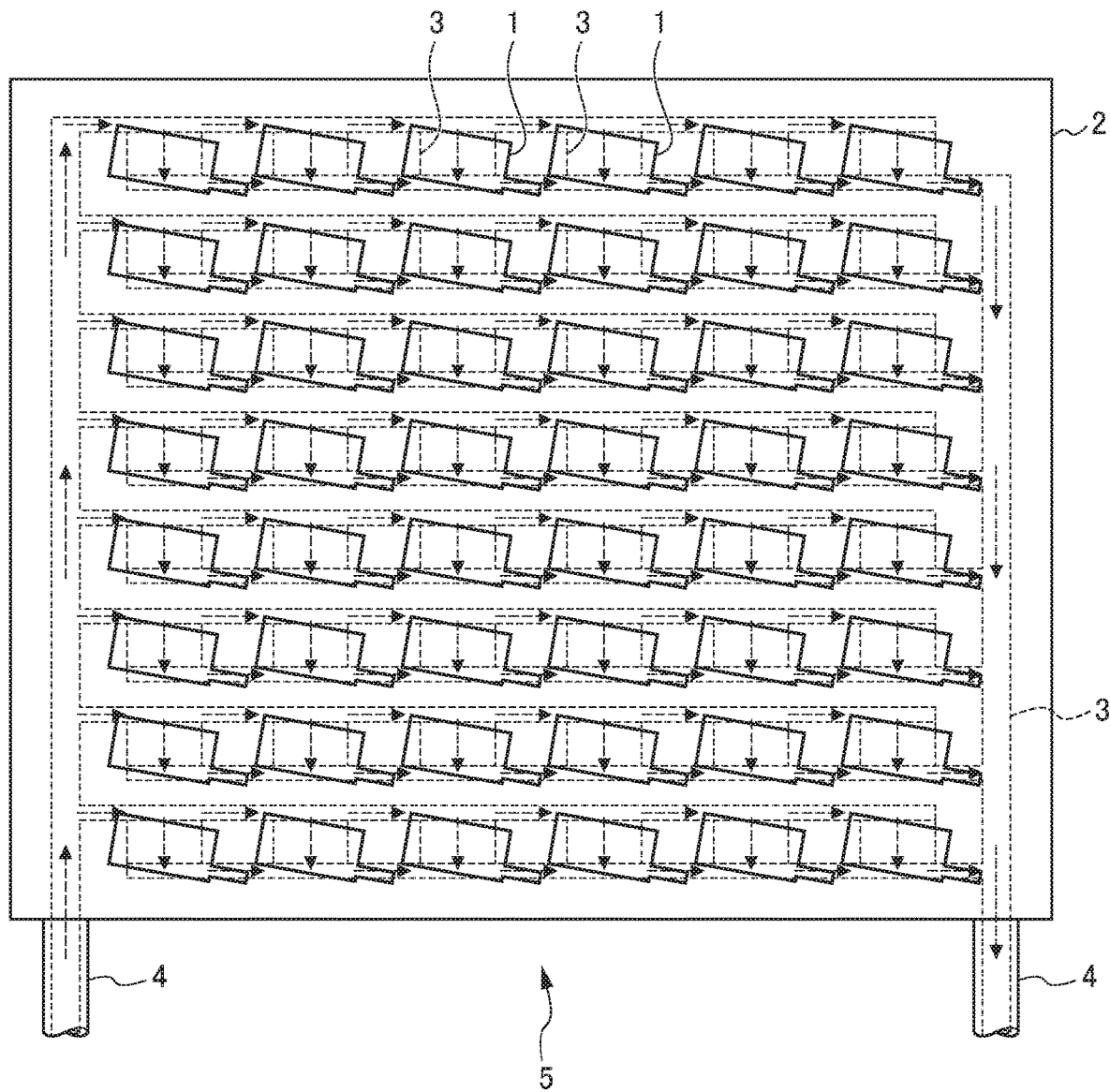
FIG. 2 is a plan view schematically illustrating a plurality of LD modules and another conventional cooling structure for cooling the plurality of LD modules.
Figure 3:
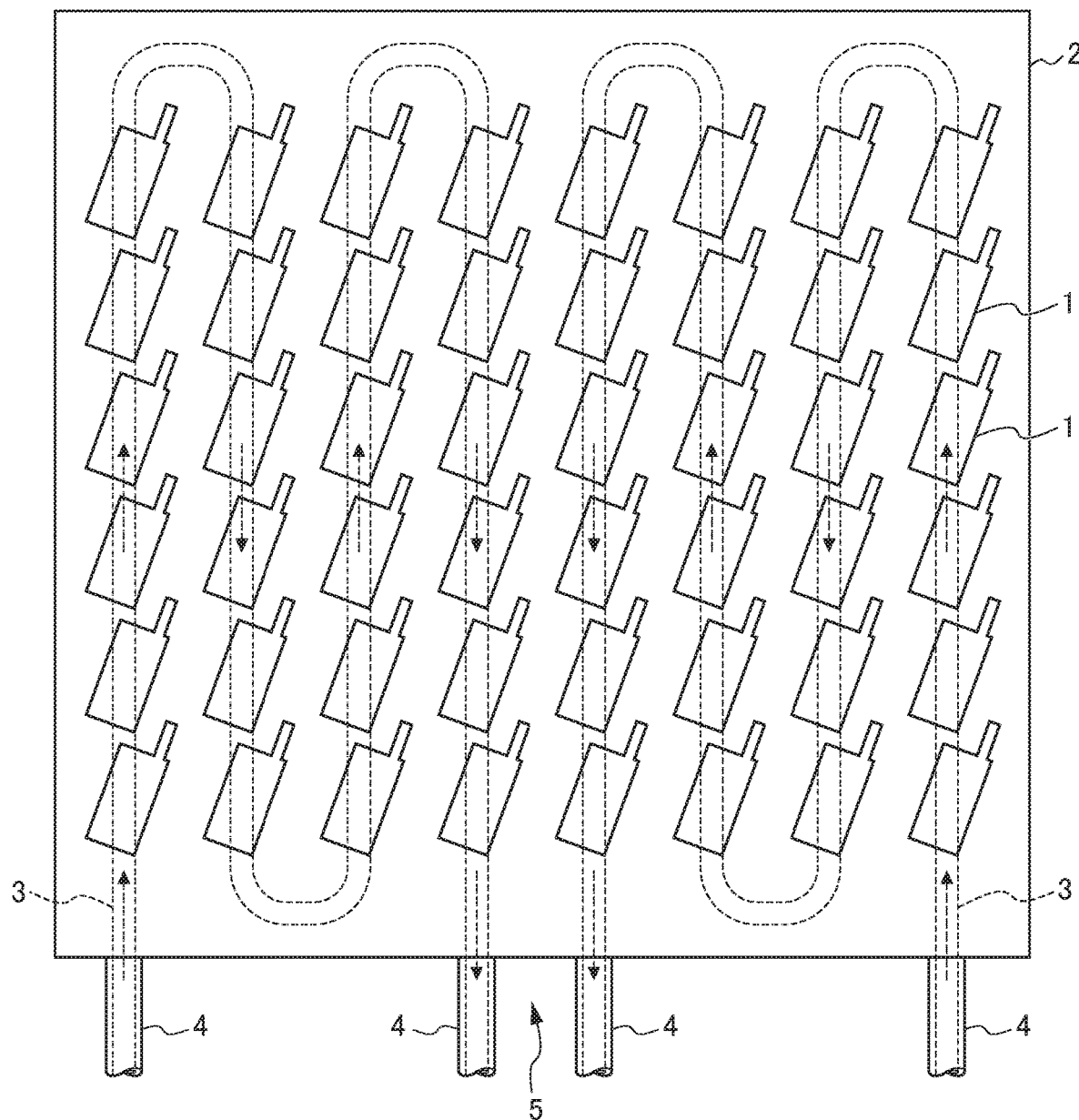
FIG. 3 is a plan view schematically illustrating a plurality of LD modules and further another conventional cooling structure for cooling the plurality of LD modules.

In the following, embodiments of a laser apparatus comprising a cooling structure for cooling a plurality of LD modules in the present disclosure will be explained with reference to the drawings. In each drawing, the same reference sign is applied to the same member. Further, components to which the same reference sign are applied in the different drawings shall mean the components having the same function. Meanwhile, the scale of these drawings is appropriately changed so as to be easily visible. In addition, a form shown in the drawings is one example for embodying the present invention, and the present invention is not limited to the shown form.

First Embodiment

Figure 4:
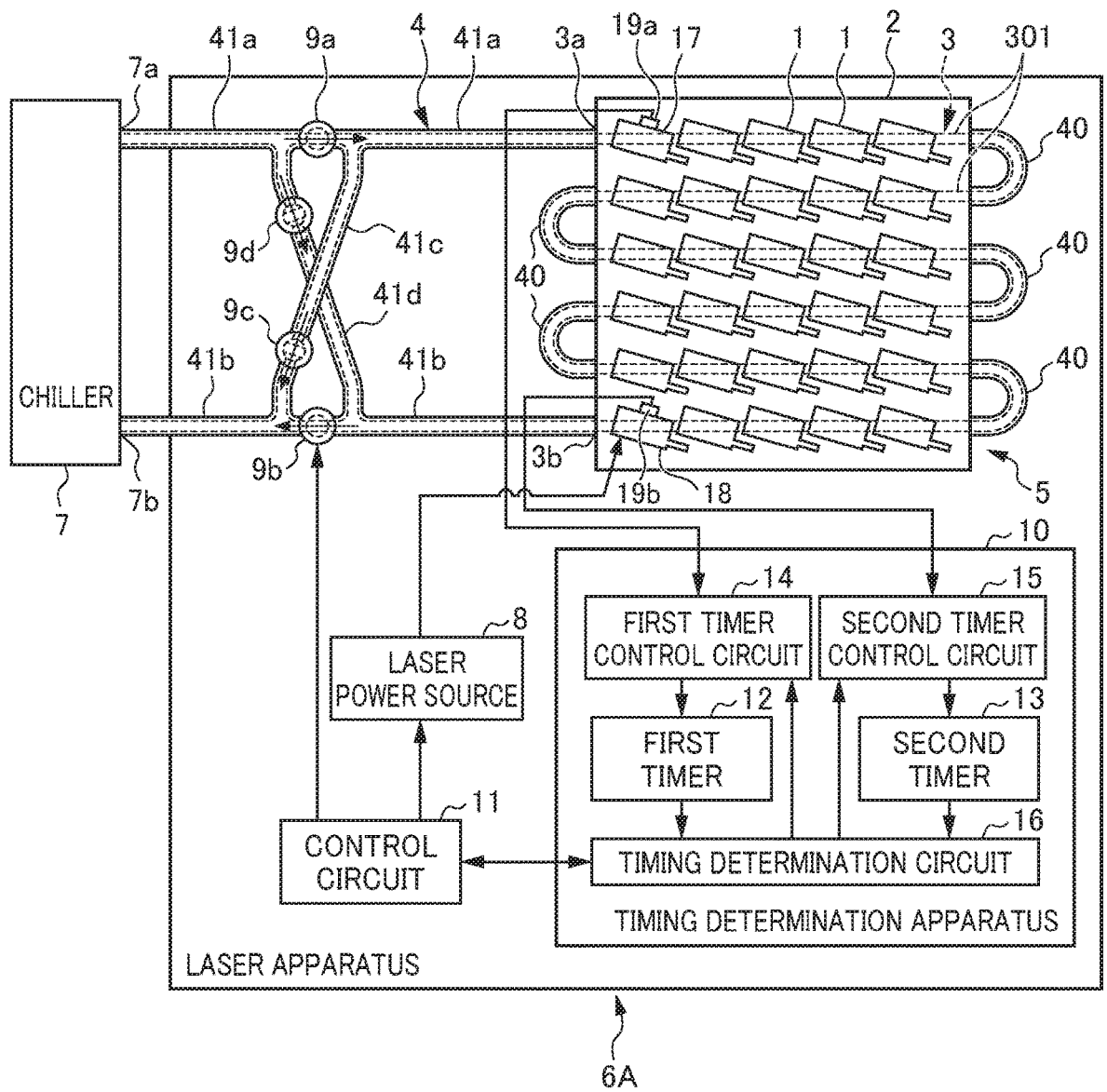
FIG. 4 is a block diagram illustrating a conceptual structure of a laser apparatus according to a first embodiment in which a portion related to cooling of the LD module is represented in a plan view illustrating a schematic structure.

FIG. 4 is a block diagram illustrating a conceptual structure of a laser apparatus according to a first embodiment, in which an LD module/cooling plate assembly which is a portion related to cooling of the LD module is represented in a plan view illustrating a schematic structure. A laser apparatus 6A comprises a plurality of laser diode modules (LD modules) 1 on the surface of a cooling plate 2 of an LD module/cooling plate assembly 5. The plurality of LD modules 1 is disposed with the cooling plate 2 thermally connected. A driving current is supplied to the plurality of LD modules 1 in series.

Within the cooling plate 2, a cooling liquid flow path 3 is formed shown by a broken line in FIG. 4. To the cooling liquid flow path 3, a cooling liquid is supplied from a cooling liquid supply apparatus 7. The cooling liquid flows from the cooling liquid supply apparatus 7 to the cooling liquid flow path 3 formed in the cooling plate 2 via a cooling liquid pipe 4. The cooling liquid flowed out of the cooling liquid flow path 3 is also configured to return to the cooling liquid supply apparatus 7 via the cooling liquid pipe 4. In the cooling liquid supply apparatus 7, a circulating cooling liquid supply apparatus which is generally called a chiller is used in this embodiment. The plurality of LD modules 1 is disposed along the cooling liquid flow path 3, and the cooling liquid flow path 3 is cooled by flowing the cooling liquid therethrough.

The laser apparatus 6A comprises a laser power source 8 which supplies a driving current to the plurality of LD modules 1; four switch valves 9a-9d which are provided in the cooling liquid pipes 4 connected to the cooling liquid flow path 3; a timing determination apparatus 10 which determines a timing for switching a flow direction of the cooling liquid by the switch valves 9a-9d; and a control circuit 11 for outputting a driving current output command to the laser power source 8, and outputting a valve switch command to the switch valves 9a-9d by referencing the determination result of the timing determination apparatus 10. The switch valves 9a-9d are made up of a two-way valve for switching the flow direction of the cooling liquid which flows through the cooling liquid flow path 3.

In the present embodiment, the cooling liquid pipe 4 provided between the cooling liquid supply apparatus 7 and the cooling plate 2 is composed of a first cooling liquid pipe 41*a*, a second cooling liquid pipe 41*b*, a third cooling liquid pipe 41*c* and a fourth cooling liquid pipe 41*d*. The first cooling liquid pipe 41*a* connects between a cooling liquid outlet 7*a* of the cooling liquid supply apparatus 7 and a first connecting part 3*a* of the cooling liquid flow path 3 formed in the cooling plate 2. The switch valve 9*a* is provided in the middle of the first cooling liquid pipe 41*a*. The second cooling liquid pipe 41*b* connects between a cooling liquid inlet 7*b* of the cooling liquid supply apparatus 7 and a second connecting part 3*b* of the cooling liquid flow path 3 formed in the cooling plate 2. The switch valve 9*b* is provided in the middle of the second cooling liquid pipe 41*b*.

The third cooling liquid pipe 41*c* and the fourth cooling liquid pipe 41*d* connect between the first cooling liquid pipe 41*a* and the second cooling liquid pipe 41*b* so that the cooling liquid can circulate therebetween. In detail, one end of the third cooling liquid pipe 41*c* is connected between a switch valve 9*a* in the first cooling liquid pipe 41*a* and the first connecting part 3*a* of the cooling liquid flow path 3. The other end of the third cooling liquid pipe 41*c* is connected between the switch valve 9*b* in the second cooling liquid pipe 41*b* and the inlet 7*b* of the cooling liquid supply apparatus 7. The switch valve 9*c* is provided in the middle of the third cooling liquid pipe 41*c*. One end of the fourth cooling liquid pipe 41*d* is connected between the switch valve 9*a* in the first cooling liquid pipe 41*a* and the outlet 7*a* of the cooling liquid supply apparatus 7. The other end of the fourth cooling liquid pipe 41*d* is connected between the switch valve 9*b* in the second cooling liquid pipe 41*b* and the second connecting part 3*b* of the cooling liquid flow path 3. The switch valve 9*d* is provided in the middle of the fourth cooling liquid pipe 41*d*.

Since the switch valves 9*a*-9*d* are composed of a two-way valve, when the switch valves 9*a*, 9*b* are in the opening state and the switch valves 9*c*, 9*d* are in the closing state as shown in FIG. 4, the cooling liquid flowed out of the outlet 7*a* of the cooling liquid supply apparatus 7 flows through, in the order of: the first cooling liquid pipe 41*a*; the first connecting part 3*a* of the cooling liquid flow path 3; the cooling liquid flow path 3; the second connecting part 3*b* of the cooling liquid flow path 3; and the second cooling liquid pipe 41*b*, and into the inlet 7*b* of the cooling liquid supply apparatus 7. When the switch valves 9*a*, 9*b* are switched to the closing state and the switch valves 9*c*, 3*d* are switched to the opening state, the cooling liquid flowed out of the outlet 7*a* of the cooling liquid supply apparatus 7 flows into the fourth cooling liquid pipe 41*d* in the middle of the first cooling liquid pipe 41*a*, through the second cooling liquid pipe 41*b* and into the second connecting part 3*b* of the cooling liquid flow path 3. The cooling liquid flowing through the cooling liquid flow path 3 and flowed out of the outlet 3*a* flows into the third cooling liquid pipe 4*c* in the middle of the first cooling liquid pipe 41*a*, through the second cooling liquid pipe 41*b* and into the inlet 7*b* of the cooling liquid supply apparatus 7. Therefore, the flow direction of the cooling liquid flowing through the cooling liquid flow path 3 can be switched to the reverse direction by switch controlling the opening and the closing of the switch valves 9*a*, 9*b* and the switch valves 9*c*, 9*b*.

Meanwhile, the cooling liquid flow path 3 of the present embodiment is composed of a plurality of parallel linear flow paths 301 across the cooling plate 2. Adjacent linear flow paths 301, 301 are connected in the outside of the cooling plate 2 by a plurality of U-shaped tubes 40 so that the cooling liquid can circulate therethrough. The cooling liquid flow path 3 thereby is composed of one flow path which flows immediately below the plurality of LD modules 1 in series between the first connecting part 3*a* and the second connecting part 3*b*.

The control circuit 11 is composed of an arithmetic circuit such as a CPU for executing arithmetic processing related to various kinds of control for the laser apparatus 6A; a memory circuit for storing programs, data and the like necessary to various kinds of control for the laser apparatus 6A; a drive circuit for driving the laser power source 8; and a communication circuit and the like for communicating each unit of the laser apparatus 6A such as the timing determination apparatus 10 and the switch valves 9*a*-9*d* (all of which are not shown).

In FIG. 4, a thick solid line arrow connecting between the respective functional blocks and the like shows an output direction in communication, a supply direction of the driving current and the like. However, in order to avoid the complex diagram, an arrow which represents the driving current supply from the laser power source 8 to the plurality of LD modules 1 only shows an arrow from the laser power source 8 to one LD module 1 which is arranged in the farthest edge, and a line or the like showing cabling between the LD modules 1 is omitted. Further, while four switch valves composed of two-way valves are provided in this embodiment, also for an arrow from the control circuit 11 to the switch valves 9*a*-9*d*, only one arrow from the control circuit 11 to the one switch valve 9*b* is shown, and the arrow to the other switch valves 9*a*, 9*c*, 9*d* is omitted.

The laser light emitted from the plurality of LD modules 1 is coupled by an optical coupler and the like to irradiate a work from a processing head as a light source in its original state, or the laser light is used as an excitation light source for a fiber laser to irradiate a work from a processing head after passing from the fiber laser through a delivery fiber in order to execute laser processing. However, in FIG. 4, laser optical components subsequent to these LD modules 1 are omitted, including optical fibers in each LD module 1 for extracting the laser light therefrom.

Although the timing determination apparatus 10 also comprises an arithmetic circuit for executing arithmetic processing necessary to determine the timing for switching the flow direction of the cooling liquid by the switch valves 9*a*-9*d*; and a memory circuit for recording programs, data and the like necessary to perform arithmetic processing, any representation is omitted. In the present embodiment, the timing determination apparatus 10 comprises two timers: a first timer 12; and a second timer 13 therein, and further comprises a first timer control circuit 14 and a second timer control circuit 15 for controlling the progress of the respective timers. In addition, the timing determination apparatus 10 comprises a timing determination circuit 16 as an arithmetic circuit for receiving a time measurement result from the first timer 12 and the second timer 13 to determine the timing for switching the flow direction of the cooling liquid by the switch valves 9*a*-9*d*.

In the present embodiment, when the cooling liquid flows from the first connecting part 3*a* to the second connecting part 3*b* in the cooling liquid flow path 3, two temperature sensors 19*a*, 19*b* are mounted on the two LD modules 1: the LD module 17 arranged on the most upstream side; and the LD module 18 arranged on the most downstream side among the plurality of LD modules 1 on the cooling plate 2. These temperature sensors 19*a*, 19*b* measure a temperature of a base plate portion which is close to a position where a COS (chip on substrate) in which an LD chip is mounted on the substrate is arranged, in a package of each LD module 17, 18. The base plate portion in the package of the LD modules 17, 18 is a temperature variation part where the rise in temperature is accompanied by heat generated in a heat-generating part of the LD module 1.

The timing determination apparatus 10 determines the timing for switching the flow direction of the cooling liquid by the switch valves 9a-9d based on temperature time series data outputted from the temperature sensors 19a, 19b so that the difference of the life consumption between the LD module 17 and the LD module 18 is reduced.

For the laser apparatus 6A of the present embodiment, in its simplest embodiment, an optical output from the whole of the plurality of LD modules 1 is defined as a rating optical output, or a driving current supplied to each LD module 1 is defined as a rating driving current. With respect to the laser power source 8, on-off only control for the driving current is performed by the control circuit 11. Even with such a simple control, after the constant rating driving current is supplied to the LD modules 1, the temperature of the LD modules 1 does not always reach the constant temperature and achieve equilibrium immediately due to the heat capacity of the cooling plate 2 and the like. For this reason, the life consumption cannot be estimated accurately only by a simple accumulation of the actual driving time.

Figure 5:
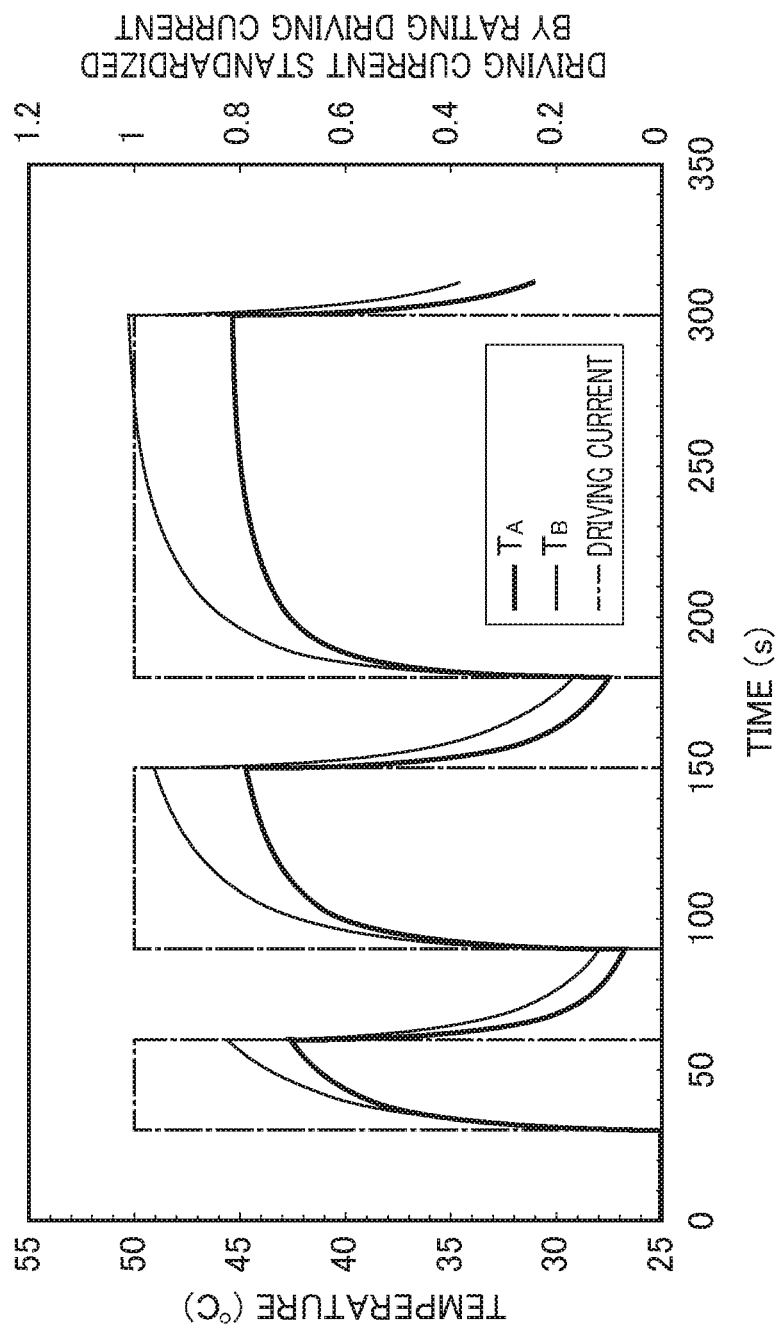
FIG. 5 is a graph illustrating an example of the change in the driving current supplied to the LD module over time, and temperature time series data measured by a temperature sensor mounted on a predetermined position in the two LD modules, which is accompanied by the change in the driving current over time.

FIG. 5 illustrates an example of on and off of the driving current supplied to each LD module 1, and time series data of the temperature $T_A$ measured by the temperature sensor 19a mounted on the LD module 17 and the temperature $T_B$ measured by the temperature sensor 19b mounted on the LD module 18 with respect to the driving current. The time series data in FIG. 5 shows an example of the case where laser processing is performed by supplying the rating driving current to each LD module 1 for 30 seconds, then, after 30 seconds from the laser processing, subsequent laser processing is performed by supplying the rating driving current thereto for 60 seconds, and then, after 30 seconds from the subsequent laser processing, subsequent laser processing is further performed by supplying the rating driving current thereto for 120 seconds. The main reason why the time series data shows transient temperature change as shown in FIG. 5 is that the cooling plate 2 and the LD modules 1 have significant heat capacity. The graph in FIG. 5 can be obtained by a simulation of a non-constant thermal fluid.

Further, the reason why the temperature $T_B$ is higher than the temperature $T_A$ is that the LD module 18 is arranged in the vicinity of the cooling liquid flow path 3 at the more downstream side than the LD module 17, and the temperature of the cooling liquid increases when the time series data shown in FIG. 5 is obtained. The life consumption of each LD module 1 depends on the temperature of the p-n junction of the LD which is a heat-generating part in the LD included in each LD module 1. However, since the heat capacity of the LD chip, including the substrate on which the LD chip is mounted, is small as compared with the cooling plate 2 and the package of the LD modules 1, when the driving current is supplied to the LD module 1, the temperature of the p-n junction of the LD is changed depending on the change in temperature of a temperature variation part in the LD modules 17, 18 on which the temperature sensors 19a, 19b are mounted. When the driving current is constant, the difference between the temperature of the p-n junction of the LD and the temperature measured by the temperature sensors 19a, 19b is nearly constant, and therefore the life consumption pace can be evaluated using the temperature measured by the temperature sensors 19a, 19b.

It is known that the life consumption pace of a semiconductor device such as an LD increases exponentially with the inverse of the absolute temperature. Because of this, for example, assuming that the driving current is kept on for a long time and an equilibrium temperature at which the temperature where the temperature sensor 19a of the upstream side LD module 17 is mounted reaches equilibrium is set as $T_{EQ}$ (=45.7° C.), and when there is an experimental result that the life consumption pace doubles when the temperature measured by the sensor 19a is 10K higher than that of $T_{EQ}$, it is found that the relationship between the temperature measured by the temperature sensor 19a and the life consumption pace, namely the relationship of timer count speed when the first timer control circuit 14 and the second timer control circuit 15 respectively control the progress of the first timer 12 and the second timer 13 has a relationship shown in FIG. 6.

Figure 6:
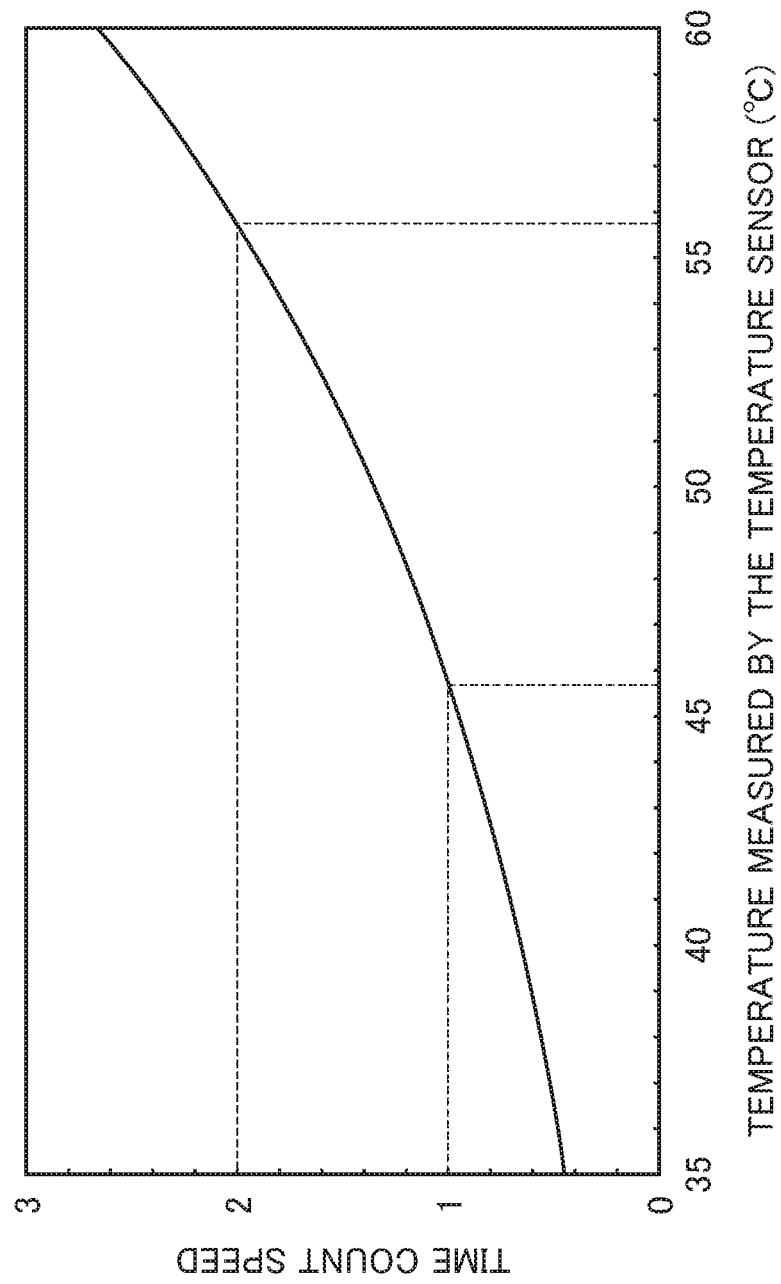
FIG. 6 is a graph illustrating an example of the relationship between the temperature measured by the temperature sensor mounted on a predetermined position in the LD module and a timer count speed of the LD module.
Figure 7:
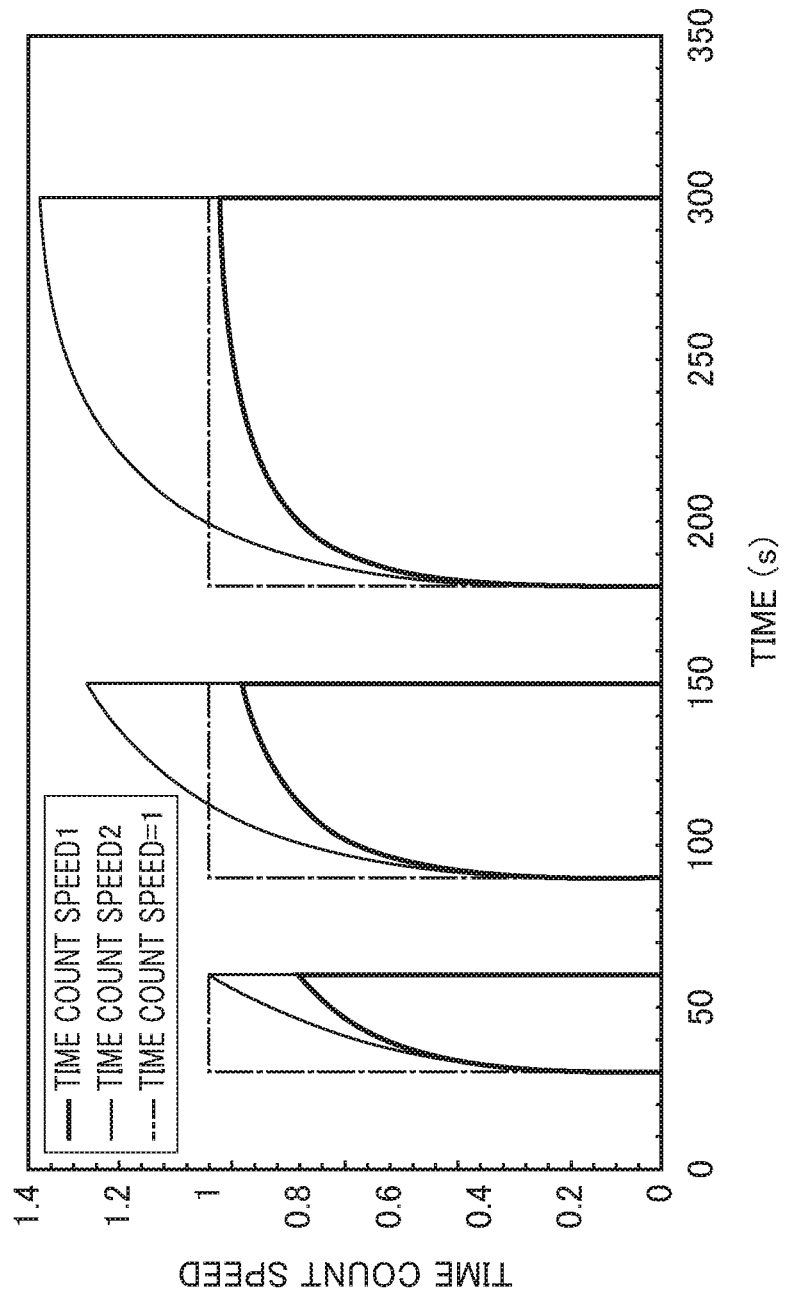
FIG. 7 is a graph illustrating the change in the timer count speed of a timer for calculating the life consumption time of the LD module over time, which is determined from the relationship between the temperature measured by the temperature sensor mounted on a predetermined position in the LD module and the timer count speed of the LD module shown in FIG. 6, in relation to temperature time series data shown in FIG. 5.

Therefore, when temperature time series data as shown in FIG. 5 is inputted to the first timer control circuit 14 and the second timer control circuit 15, the first timer control circuit 14 and the second timer control circuit 15 output control signal to make the first timer 12 and the second timer 13 progress at a timer count speed as shown in FIG. 7 by utilizing the relationship as shown in FIG. 6. Meanwhile, even when the temperature of the LD module 1 rises, degradation of the LD module 1 when the driving current is not supplied thereto is almost negligible. Because of this, the timer count speed is 0 when the driving current is not supplied to the LD module 1 and the timer count is stopped. Whether the driving current is supplied to the LD module 1 or not can be determined from the signal outputted from the control circuit 11.

As described above, when the progress of the first timer 12 and the second timer 13 is controlled, that is to say, the timer count speed 1 corresponding to the first timer 12 and the timer count speed 2 corresponding to the second timer 13 are controlled, in the example shown in FIG. 7, when first laser processing is performed for 30 seconds, the next laser processing is performed for 60 seconds, and the last laser processing is performed for 120 seconds, resulting in 210 seconds of laser processing in total, the first timer 12 makes progress for 19.2 seconds, for 47.6 seconds and for 106.3 seconds respectively resulting in progress for 173.1 seconds in total. On the other hand, the second timer 13 makes progress for 22.1 seconds, for 60.9 seconds and for 143.7 seconds respectively, resulting in progress for 226.7 seconds in total. Meanwhile, the number of seconds at which timer count speed makes progress by the first timer 12 and the second timer 13 is obtained by time integral of the timer count speed 1 and the timer count speed 2 in the graph showing the relationship between the timer count speed and the time of FIG. 7, respectively.

Thus, as shown an alternate long and short dash line in FIG. 7, in comparison with the actual driving time of the LD module 1 which is determined by always setting as the timer count=1 when the rating driving current is supplied to the LD module 1, the time counted by the life consumption time counting timer is considerably different. Particularly, the difference of the ratio increases when the laser processing time is short. As is evident from FIG. 5 and FIG. 7, when the on time and the off time of the driving current are sufficiently long, the transient temperature change shown in the drawing can be disregarded. However, in the practical laser processing, the on-off of the driving current is often repeated at time intervals from several seconds to several tens of seconds.

Therefore, if such a transient temperature change is disregarded, the timing for switching the flow direction of the cooling liquid will be determined without taking a phenomenon of the shortened life or the increased average failure rate with the rise in temperature of a semiconductor device including an LD, into account. This makes it difficult to achieve the goal of switching the flow direction of the cooling liquid with the timing at which the life load difference between respective LD modules 1 can be effectively reduced.

Meanwhile, the expression of the shortened life and the expression of the increased average failure rate do not have the same meaning physically. However, in order to simplify the explanation, hereinbelow, the expression of a shortened life by ½, for example, is used to include the meaning of a double increased average failure rate.

When time counted by the first timer 12 and time counted by the second timer 13 are respectively defined as a time 1 and a time 2, the timing determination circuit 16 determines the timing for switching the flow direction of the cooling liquid from the time 1 and the time 2. For example, the timing determination circuit 16 determines the timing for switching the flow direction of the cooling liquid when the difference between the time 1 and the time 2 exceeds a predetermined time, and outputs the determination result to the control circuit 11.

Upon receiving the determination result, the control circuit 11 outputs a command for switching the flow direction of the cooling liquid to the switch valves 9a-9d when the driving current is not supplied to the LD module 1, or when the laser apparatus 6A cannot perform laser oscillation immediately. This causes the switch valves 9a-9d to switch the flow direction of the cooling liquid. When the timing for switching the flow direction of the cooling liquid is thus determined and the flow direction of the cooling liquid is switched, the widening of the difference of the life consumption time between the LD module 17 and the LD module 18 over a predetermined time can be prevented, otherwise the biggest difference of life consumption time is created therebetween.

Figure 8:
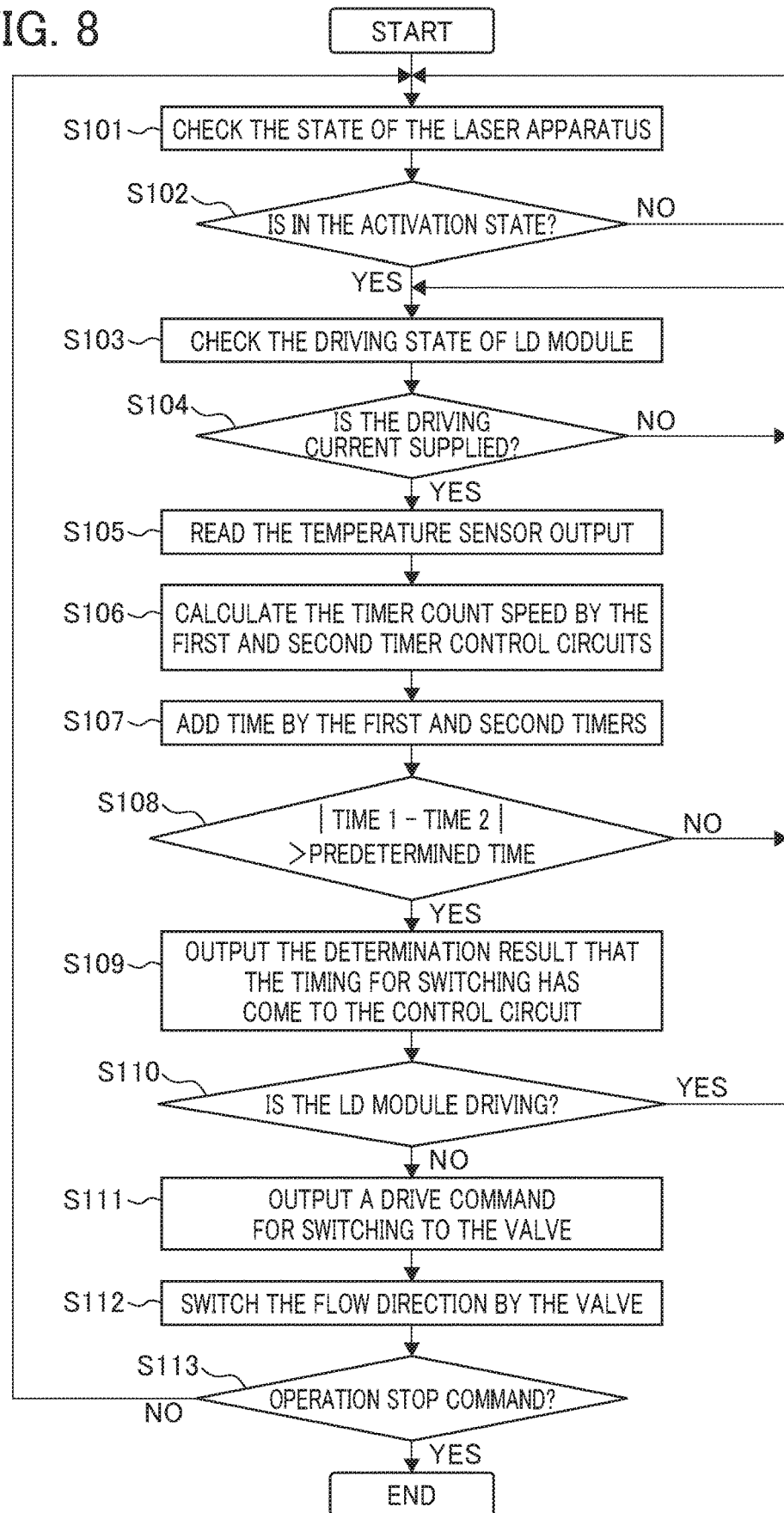
FIG. 8 is a flowchart showing an operational flow for switching the flow direction of the cooling liquid in the laser apparatus according to the first embodiment.

FIG. 8 is a flowchart showing an operational flow for switching the flow direction of the cooling liquid in the laser apparatus 6A. When the power source of the laser apparatus 6A is turned on, the timing determination circuit 16 checks the state of the laser apparatus 6A from the control circuit 11 (Step S101) to determine whether the laser apparatus 6A is in a laser oscillation-enabled activation state or not (Step S102). When the laser apparatus 6A is determined to be in the laser oscillation-enabled activation state, the timing determination circuit 16 checks the driving state of the LD module 1 at 10 ms intervals, for example, to determine whether the driving current is supplied to the LD module 1 or not (Step S104).

When the driving current is determined to be supplied to the LD module 1, the timing determination circuit 16 commands to read the output from the temperature sensors 19a, 19b respectively connected to the first timer control circuit 14 and the second timer control circuit 15 (Step S105). The first timer control circuit 14 and the second timer control circuit 15 calculate, from the read output, namely, the temperature from the temperature sensors 19a, 19b, the timer count speed by utilizing data showing the relationship between the temperature measured by the temperature sensors 19a, 19b and the timer count speed as shown in FIG. 6 (Step S106). Then, the first tamer control circuit 14 and the second timer control circuit 15 command the first timer 12 and the second timer 13 to add the time of 10 ms multiplied by the timer count speed, respectively. By this, the time 1 and the time 2 are updated (Step S107).

Subsequently, the timing determination circuit 16 determines whether the difference between the updated time 1 and time 2 is larger than a predetermined time or not (Step S108). When the difference between the updated time 1 and time 2 is determined to be larger than the predetermined time, the timing determination circuit 16 outputs to the control circuit 11 the determination result that timing for switching the flow direction of the cooling liquid has come (Step S109).

Upon receiving the determination result, the control circuit 11 determines whether the LD module 1 is driving or not by the supply of the driving current to the LD module 1 (Step S110). When the LD module 1 is determined not to be driving, a driving command for switching the flow direction of the cooling liquid is outputted to the switch valves 9a-9d (Step S111). This causes the flow direction of the cooling liquid flowing through the cooling liquid flow path 3 of the cooling plate 2 to be switched (Step S112).

In this embodiment, in FIG. 4, for example, by switching the switch valves 9a, 9b from the opening state to the closing state, and simultaneously switching the switch valves 9c, 9d from the closing state to the opening state, the flow direction of the cooling liquid flowing through the cooling liquid flow path 3 of the cooling plate 2 can be switched to the reverse direction.

Next, at Step S113, when the operation stop command is determined not to be given to the timing determination apparatus 10 due to the replacement of the LD module/cooling plate assembly 5 and the like, the state of the laser apparatus 6A is checked by returning to Step S101. At Step S113, when the operation stop command is determined to be given to the timing determination apparatus 10, the timing determination apparatus 10 terminates its operation. At Step S102, when the laser apparatus 6A is determined not to be in the laser oscillation-enabled activation state, the state of the laser apparatus 6A is repeatedly checked by returning to Step S101. At Step S104, when the driving current is determined not to be supplied to the LD module 1, at Step S108, when the difference between the updated time 1 and time 2 is determined not to be larger than a predetermined time, or at Step S110, when the LD module 1 is determined to be driving, the timing determination circuit 16 continuously checks the driving state of the LD module 1 at 10 ms intervals by returning to Step S103.

Thus, in this embodiment, by repeating operations from Step S101 to Step S113 described above, the flow direction of the cooling liquid can be switched at the appropriate timing for reducing the difference of life consumption time between respective LD modules 1. This can solve the problem that the replacement timing for the LD module/cooling assemble 5 is accelerated because the end-of-life of some of LD modules 1 has come earlier than that of the other LD modules 1 among the plurality of LD modules 1.

As discussed above, according to the laser apparatus 6A of the present embodiment, when it is driven in the rating optical output condition or in the rating driving current condition, the difference of life consumption time between any LD modules 1 can be suppressed within a predetermined time or time slightly over the predetermined time even if the LD module 1 has a temperature change, including a transient change. A detailed method for determining a predetermined time described above will be explained later.

In this embodiment, although the temperature sensors 19a, 19b are mounted on the base plate portion of the package of the LD module 1 in both of the LD module 17 and the LD module 18, the present invention is not limited thereto. In order to keep the temperature difference between the temperature of the p-n junction of the LD and the temperature measured by the temperature sensors 19a, 19b constant with good precision, it is desirable that the mounted position of the temperature sensors 19a, 19b is set to a position where the temperature in vicinity of the heat path into which the most heat in the heat-generating part (heat flowing from the heat-generating part into the cooling plate 2) flows can be measured. However, the mounted position of the temperature sensors 19a, 19b, in principle, may be a position where the temperature of the heat-generating part of the LD module 1 can be estimated from the temperature of the position on which the temperature sensors 19a, 19b are mounted. Therefore, the mounted position of the temperature sensors 19a, 19b may be provided in a position on the cooling plate 2 close to the upstream side and a position on the cooling plate 2 close to the downstream side when the cooling liquid flows from one direction of the cooling plate 2.

In addition, when the flow rate of the cooling liquid is known, the rise in temperature of the cooling liquid due to heat generated in the LD module 1 can be estimated by calculation. Because of this, the temperature sensor can be provided in one of the LD modules 17, 18 or only one part on the cooling plate 2. Further, when the flow rate and the temperature of the cooling liquid are known from the setting condition of the cooling liquid supply apparatus 7 and the like, and when the heat capacity of the cooling plate 2 and the LD module 1 is known, a change in temperature of the LD module 1 as shown in FIG. 5 can be estimated by calculation even if the temperature sensor is not mounted on the laser apparatus 6A. Thus, mounting the temperature sensor on the laser apparatus 6A side is not an essential condition upon performing the above-described functions.

In the case where the temperature and the flow rate of the cooling liquid flowing into the cooling plate 2 are constant, the on-time and the off-time for the driving current are sufficiently long, and the transient temperature change of the LD module can be disregarded, the temperature sensor is not needed, and there can be the only one timer and the only one timer control circuit. The timer control circuit may control the timer so that timer makes progress only when the rating current is supplied to the LD module. The timing determination circuit 16 may determine only whether the timing for switching the flow direction of the cooling liquid has come or not, each time after the elapse of a predetermined time measured by the timer.

Second Embodiment

Figure 9:
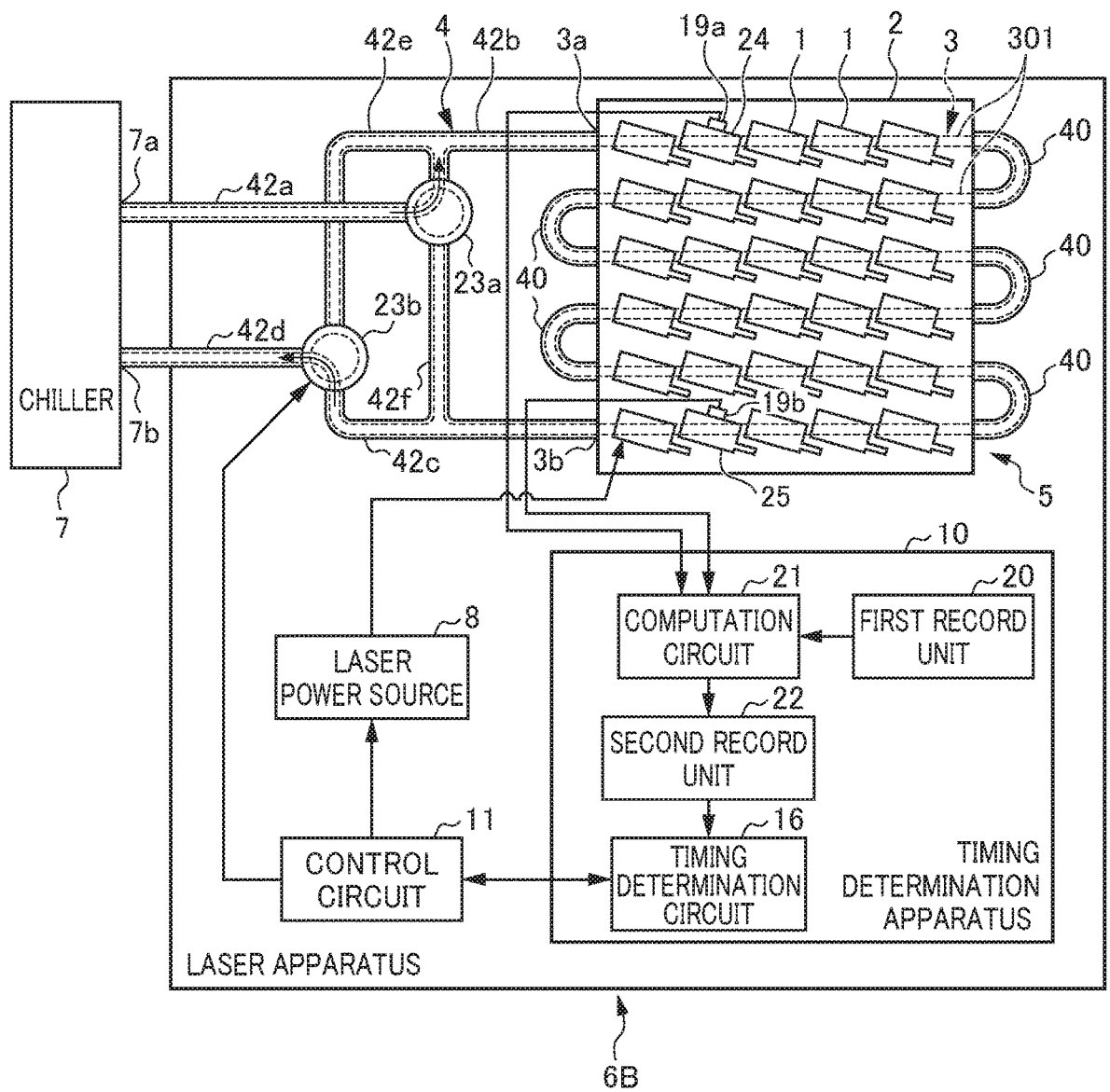
FIG. 9 is a block diagram illustrating a conceptual structure of a laser apparatus according to a second embodiment in which a portion related to cooling of the LD module is represented in a plan view illustrating a schematic structure.

FIG. 9 is a block diagram showing a conceptual structure of a laser apparatus according to a second embodiment. As in FIG. 4 of the first embodiment, the LD module/cooling plate assembly 5 which is a portion related to cooling of the LD module 1 is represented in a plan view showing a schematic structure. As in FIG. 4, the cooling liquid flow path 3 in the cooling plate 2 is represented by a broken line. In addition, although a thick solid line arrow connecting between respective functional blocks and the like shows an output direction in communication, a supply direction of the driving current and the like, in order to avoid the complex diagram, an arrow which represents the driving current supply from the laser power source 8 to the plurality of LD modules 1 only shows an arrow from the laser power source 8 to one LD module 1 which is arranged in the farthest edge, and a line or the like showing cabling between the LD modules 1 is omitted. Also, representation of laser optical components subsequent to these LD modules 1 are omitted, including optical fibers in each LD module 1 for extracting the laser light therefrom.

As a first different point, the second embodiment of the laser apparatus 6B shown in FIG. 9 is different from that of FIG. 4 of the first embodiment in that the timing determination apparatus 10 comprises a first record unit 20, a second record part 22 and a computation circuit 21, instead of the first timer control circuit 14, the second timer control circuit 15, the first timer 12 and the second timer 13 of FIG. 4.

The first record unit 20 records data on at least one acceleration factor of a first acceleration factor ($k_1(P_o, T_v)$) and a second acceleration factor ($k_2 (I_d, T_v)$). The first acceleration factor ($k_1 (P_o, T_v)$) shows dependency on an optical output ($P_o$) and temperature of a temperature variation part ($T_v$) of the LD module 1. The second acceleration factor (k2 ($I_d, T_v$)) shows dependency on a driving current supplied to the LD module 1 ($I_d$) and temperature of a temperature variation part ($T_v$). The first acceleration factor ($k_1 (P_o, T_v)$) and the second acceleration factor (k2 ($I_d, T_v$)) are, on the basis of the life consumption speed when the LD module 1 is driven in a standard driving condition, acceleration factors of life consumption representing the ratio (a multiplication factor) of the life consumption speed when the LD module 1 is driven in a driving condition which is different from the standard driving condition.

The computation circuit 21, as will be described later, in addition to the temperature time series data of the temperature variation part, computes the effective cumulative driving time by referencing at least one time series data of the optical output time series data of the LD module 1 and the driving current time series data of the LD module 1 to perform time integral to the acceleration factor read from the first record unit 20 from the first driving start point of the LD module 1 to the latest point.

The second record unit 22 records the effective cumulative driving time of at least one LD module 1 among the plurality of LD modules 1, which is computed by the computation circuit 21. Meanwhile, also in the present embodiment, the temperature variation part is a base plate portion which is close to a position where a COS in which an LD chip is mounted on the substrate is arranged, in the package of each LD module 1, and the temperature sensors 19a, 19b are mounted on the base plate position, as in the first embodiment.

In the present embodiment, when the cooling liquid flows from the first connecting part 3a to the second connecting part 3b through the cooling liquid flow path 3, two temperature sensors 19a, 19b are mounted on the LD module arranged in a position close to the most upstream side of the cooling liquid flow path 3 (hereinafter, referred to as a first LD module 24) and the LD module arranged in a position close to the most downstream side of the cooling liquid flow path 3 (hereinafter, referred to as a second LD module 25), among the plurality of LD modules 1. The two LD modules 1 on which the temperature sensors 19a, 19b are mounted may be different LD modules, and may not necessarily be the first LD module 24 and the second LD module 25 depicted in FIG. 9. However, as described later, when the distance between the first LD module 24 and the second LD module 25 along the cooling liquid flow path 3 is close, accuracy for determining the appropriate timing deteriorates. Therefore, it is desirable that the distance along the cooling liquid flow path 3 is relatively apart.

As a second point which is different from that of FIG. 4 of the first embodiment, while the four switch valves 9a-9d composed of a two-way valve are used in the first embodiment, a three-way valve produced by a set of two: one inlet-side switch valve 23a; and one outlet-side switch valve 23b is used in the present embodiment. In detail, the cooling liquid pipe 4 provided between the cooling liquid supply apparatus 7 and the cooling plate 2 is composed of a first cooling liquid pipe 42a, a second cooling liquid pipe 42b, a third cooling liquid pipe 42c and a fourth cooling liquid pipe 42d, a fifth cooling liquid pipe 42e and a sixth cooling liquid pipe 42f as shown in FIG. 9. The first cooling liquid pipe 42a connects between a cooling liquid outlet 7a of the cooling liquid supply apparatus 7 and a switch valve 23a. The second cooling liquid pipe 42b connects between the switch valve 23a and a first connecting part 3a of the cooling liquid flow path 3 formed on the cooling plate 2. The third cooling liquid pipe 42c connects between a second connecting part 3b of the cooling liquid flow path 3 formed in the cooling plate 2 and the switch valve 23b. The fourth cooling liquid pipe 42d connects between the switch valve 23b and the cooling liquid inlet 7b of the cooling liquid supply apparatus 7. The fifth cooling liquid pipe 42e connects between the middle of the second cooling pipe 42e and the switch valve 23b. The sixth cooling liquid pipe 42f connects between the middle of the third cooling pipe 42c and the switch valve 23a.

Since respective switch valves 23a, 23b are composed of a three-way valve, when the switch valves 23a, 23b are in a state shown in FIG. 9, the cooling liquid flowed out of the outlet 7a of the cooling liquid supply apparatus 7 flows through, in the order of: the first cooling liquid pipe 42a; the switch valve 23a; the second cooling liquid pipe 42b; the first connecting part 3a of the cooling liquid flow path 3; the cooling liquid flow path 3; the second connecting part 3b of the cooling liquid flow path 3; the third cooling liquid pipe 42c; the switch valve 23b; and the fourth cooling liquid pipe 42d into the inlet 7b of the cooling liquid supply apparatus 7. In addition, when the core of the switch valves 23a is rotated 90° counterclockwise and the core of the switch valves 23b is rotated 90° clockwise, the cooling liquid flowed out of the outlet 7a of the cooling liquid supply apparatus 7 flows through the first cooling liquid pipe 42a, the switch valve 23a, the sixth cooling liquid pipe 42f into and through the middle of the third cooling liquid pipe 42c and flows into the second connecting part 3b of the cooling liquid flow path 3. The cooling liquid flowing through the cooling liquid flow path 3 and flowed out of the first connecting part 3a of the cooling liquid flow path 3 flows through the second cooling liquid pipe 42b into the fifth cooling liquid pipe 42e in the middle of the second cooling liquid pipe 42b and flows through the fourth cooling liquid pipe 42d into the inlet 7b of the cooling liquid supply apparatus 7. Therefore, the flow direction of the cooling liquid flowing through the cooling liquid flow path 3 can be switched to the reverse direction by switch controlling the flow path of the respective switch valves 23a, 23b.

In the present embodiment, while the number of the pipe members is reduced, the rise in temperature of the inlet-side cooling liquid due to heat exchange between the inlet-side cooling liquid and the outlet-side cooling liquid resulting from heat conduction via the switch valves 23a, 23b can be suppressed more than in the case where the two-way valve (the switch valves 9a-9d) having an open-close only function as in the first embodiment is used.

To the computation circuit 21 of the timing determination apparatus 10 in the laser apparatus 6B of the present embodiment, as mentioned above, the temperature of the temperature variation part ($T_{v1}(t)$) measured by the temperature sensor 19a which is mounted on the first LD module 24, the temperature of the temperature variation part ($T_{v2}(t)$) measured by the temperature sensor 19b which is mounted on the second LD module 25, and the optical output ($P_o(t)$) or the driving current ($I_d(t)$) are inputted as variables. The computation circuit 21 performs time integral by reading a first acceleration factor ($k_1$) or a second acceleration factor ($k_2$) corresponding to respective variables from the first record unit 20. The computation circuit 21 thereby computes the effective cumulative driving time of the first LD module 24 and the second LD module 25 as in the following equation, and records the latest effective cumulative driving time on the second record part 22:

[Math. 1]

The effective cumulative driving time of the $$\text{first LD module 24} = \int_{t_s}^{t_p} k_1(P_o(t), T_{v1}(t))dt$$

The effective cumulative driving time of the $$\text{second LD module 25} = \int_{t_s}^{t_p} k_1(P_o(t), T_{v2}(t))dt$$

Or the effective cumulative driving time of the $$\text{first LD module 24} = \int_{t_s}^{t_p} k_2(I_d(t), T_{v1}(t))dt$$

The effective cumulative driving time of the $$\text{second LD module 25} = \int_{t_s}^{t_p} k_2(I_d(t), T_{v2}(t))dt$$

$t_s$ is the first driving start point of the LD module 1. As $t_s$, the point when the shipping test has been finished or the point when the LD module 1 is driven for the first time after shipping may be set, for example. $t_p$ is the latest point. $t_p$ may be the last point when the LD module 1 has been driven so far.

In the present embodiment, when the time difference between the first effective cumulative driving time which is the effective cumulative driving time of the first LD module 24 and the second effective cumulative driving time which is the effective cumulative driving time for the second LD module 25 is defined as a first time difference, the timing determination circuit 16 determines the point when the first time difference exceeds the first setting time to be the timing for switching the flow direction of the cooling liquid and outputs the determination result to the control circuit 11.

By thus determining the timing for switching the flow direction of the cooling liquid, the widening difference of the effective cumulative driving time between LD modules 1 which have a different disposed position can be directly prevented, and variations in the end-of-life timing between LD modules 1 can be reliably reduced. Meanwhile, when the positions for arranging the first LD module 24 and the second LD module 25 are close at a distance along the cooling liquid flow path 3, the difference of the temperature of the temperature variation part in the first LD module 24 and the temperature of the temperature variation part in the second LD module 25 is reduced, and the first time difference is not so increased even when the effective cumulative driving time is increased. Because of this, accuracy for determining appropriate timing determination is degraded. Therefore, it is desirable that the distance along the cooling liquid flow path between the first LD module 24 and the second LD module 25 is relatively apart.

Although the first setting time can be set to a certain time, the first setting time can be set to a first function in which any of the first effective cumulative driving time, the second effective cumulative driving time, and the sum of the first effective cumulative driving time and the second effective cumulative driving time is defined as a first variable. The first function is, as shown in FIG. 10, a function that the first variable is in a positive range and is a weakly monotonically decreasing function, and its minimum value is defined as a positive first constant.

Figure 10:
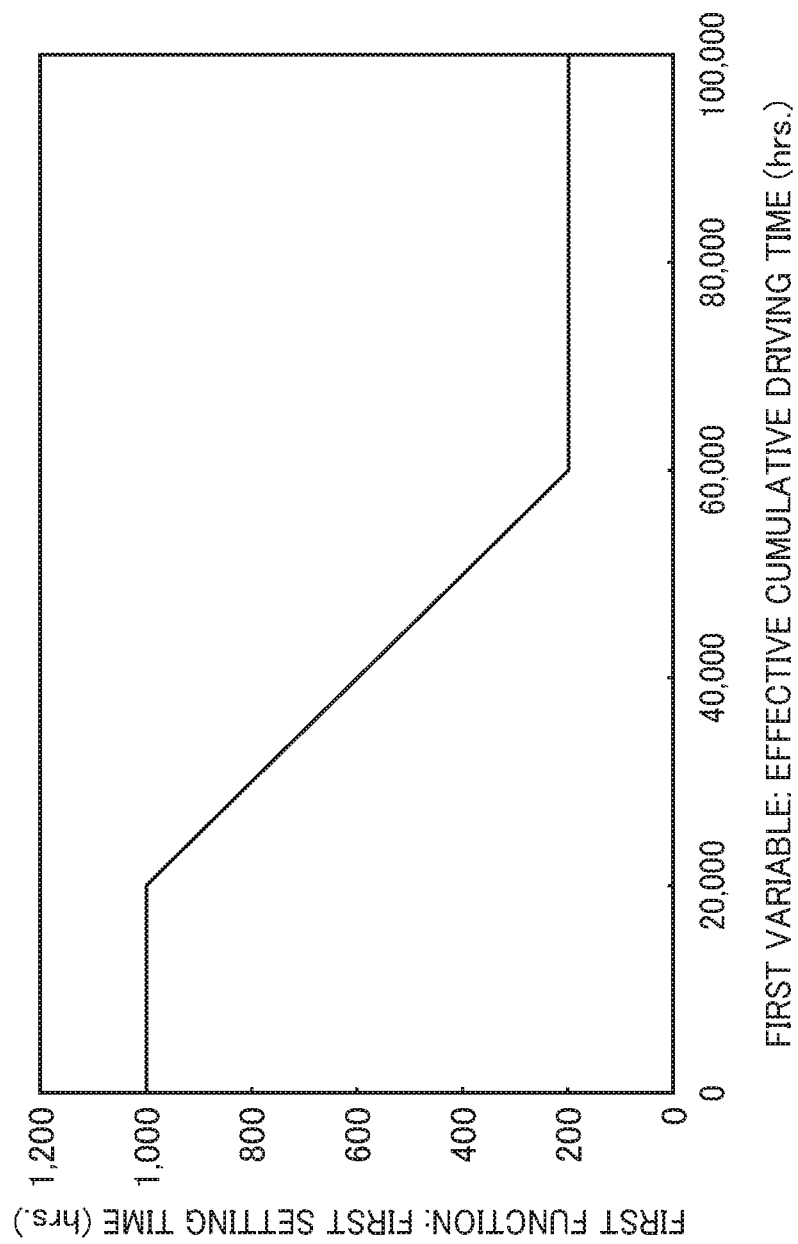
FIG. 10 is a graph illustrating a setting example of dependency of a first setting time on the effective cumulative driving time in determination criteria for determining the timing for switching the flow direction of the cooling liquid when the difference or the effective cumulative driving time between the two LD modules exceeds the first setting time.

By setting the first setting time as in FIG. 10, the flow direction of the cooling liquid may not be frequently switched, for a period of the small effective cumulative driving time during which it is not necessary to frequently switch the flow direction of the cooling liquid. Wear in the switch valves 23a, 23b and the like can be reduced because the flow direction of the cooling liquid is not switched frequently. Further, in the case where the effective cumulative driving time increases to reach the end-of-life of the LD module 1, it is preferable that the flow direction of the cooling liquid is switched before the difference of the effective cumulative driving time between the first LD module 24 and the second LD module 25 is widened too much. However, switching of the flow direction of the cooling liquid can be set so that the flow direction of the cooling liquid is not switched as frequently as a positive first constant time.

Figure 11:
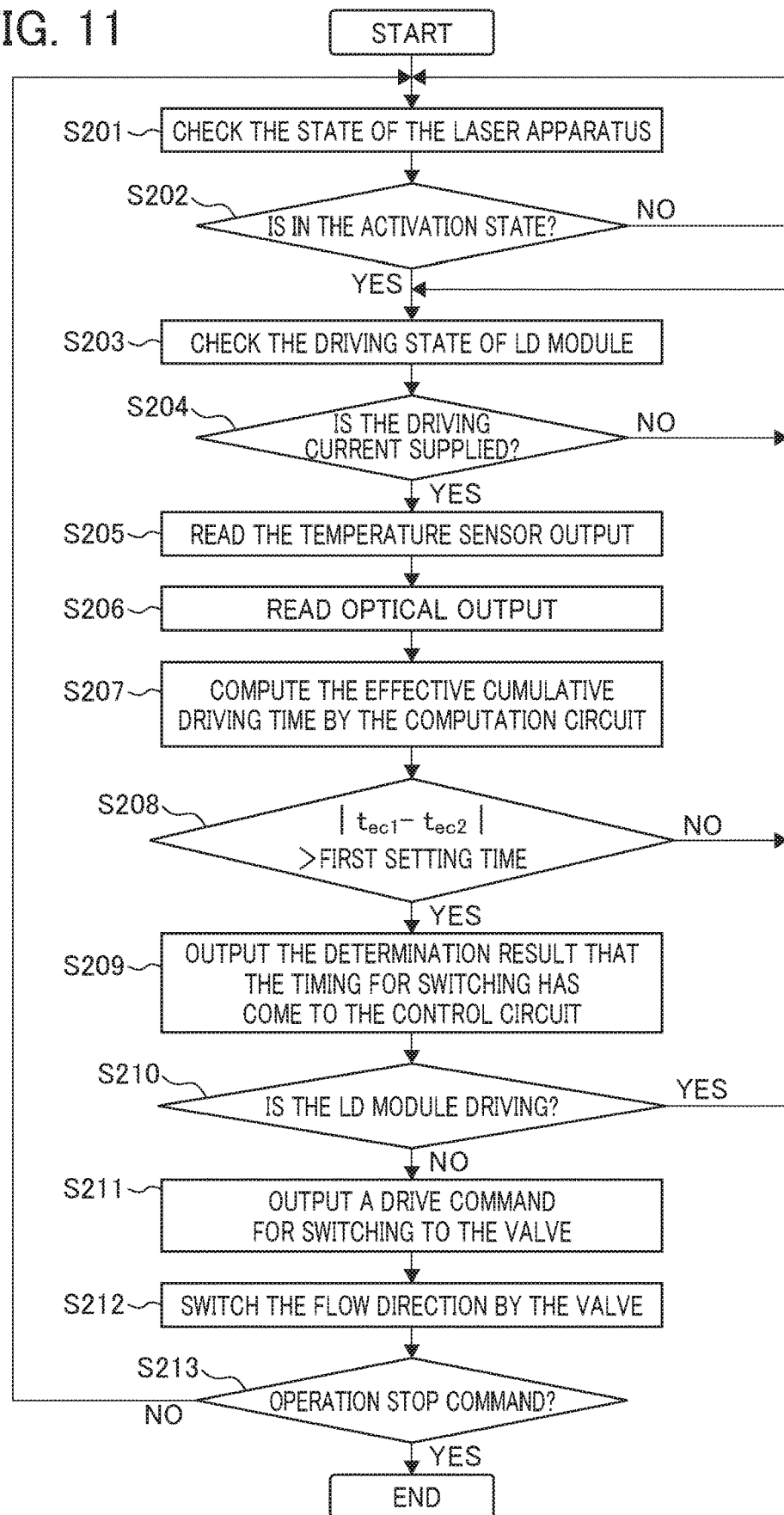
FIG. 11 is a flowchart illustrating an operational flow for switching the flow direction of the cooling liquid in the laser apparatus of the second embodiment.

FIG. 11 is a flowchart illustrating an operational flow for switching the flow direction of the cooling liquid in the laser apparatus 6B of the present embodiment. In the flowchart of FIG. 11, steps different from steps of the flowchart in FIG. 8 are Step S205-Step S208 only. For this reason, only different steps will be explained here. At Step S205, the calculation circuit 21 reads the temperature time series data which are data outputted from the two temperature sensors 19a, 19b, and, when effective cumulative driving time is calculated by the first acceleration factor in a synchronized manner with this, reads the optical output time series data (Step S206). For the optical output time series data, the optical output command from the control circuit 11 may be directly read, or the result of the actual laser output measured by an optical output detector (not shown) can be used.

Meanwhile, when the effective cumulative driving time is calculated with the second acceleration factor, the driving current time series data is read, instead of the optical output time series data. Then, the calculation circuit 21, with respect to the read temperature time series data and the read optical output time series data, calculates an effective cumulative driving time ($t_{ec1}$) of the first LD module 24 and an effective cumulative driving time ($t_{ec2}$) of the second LD module 25 by using dependency data of the first acceleration factor on the temperature and the optical output which is recorded in the first record unit 20, and records them in the second record unit 22 (Step S207). Specifically, the calculation circuit 21 adds the newly calculated effective driving time to the effective cumulative driving time which is recorded in the second record unit 22, and sets the added result as a new effective cumulative driving time. The calculation circuit 21 updates the recorded effective cumulative driving time to the new effective driving time. Next, the timing determination circuit 16 determines whether the difference between the effective cumulative driving time ($t_{ec1}$) of the first LD module 24 and the effective cumulative driving time ($t_{ec2}$) is larger than the first set time or not (Step S20). As a result, when the difference between the effective cumulative driving time ($t_{ec1}$) of the first LD module 24 and the effective cumulative driving time ($t_{ec2}$) of the second LD module 25 is determined to be larger than the first set time, the timing determination circuit 16 outputs to the control circuit 11 the determination result that timing for switching the flow direction of the cooling liquid has come.

As described above, even when the driving condition of the laser apparatus 6B is the driving condition for changing the optical output and the driving current of the LD module 1, instead of the driving condition of on-off only control with the rating optical output and the rating driving current, the laser apparatus 6B determines timing for switching the flow direction of the cooling liquid by the timing determination apparatus 10 based on the effective cumulative driving time of the LD module 1 calculated by taking the change in the LD's life degradation speed due to the magnitude of the optical output and the driving current into account, that is to say, the effective cumulative driving time in which the real driving time of the LD module 1 is transformed into the driving time in the event that the LD module 1 is driven by the standard driving condition. Because of this, according to the laser apparatus 6B of the present embodiment, the decrease in the difference of the effective cumulative driving time between the plurality of LD modules 1, in other words, the difference between the life consumption time is allowed, and the variations in the end-of-life timing of between the plurality of LD modules 1 can be reduced.

Third Embodiment

Figure 12:
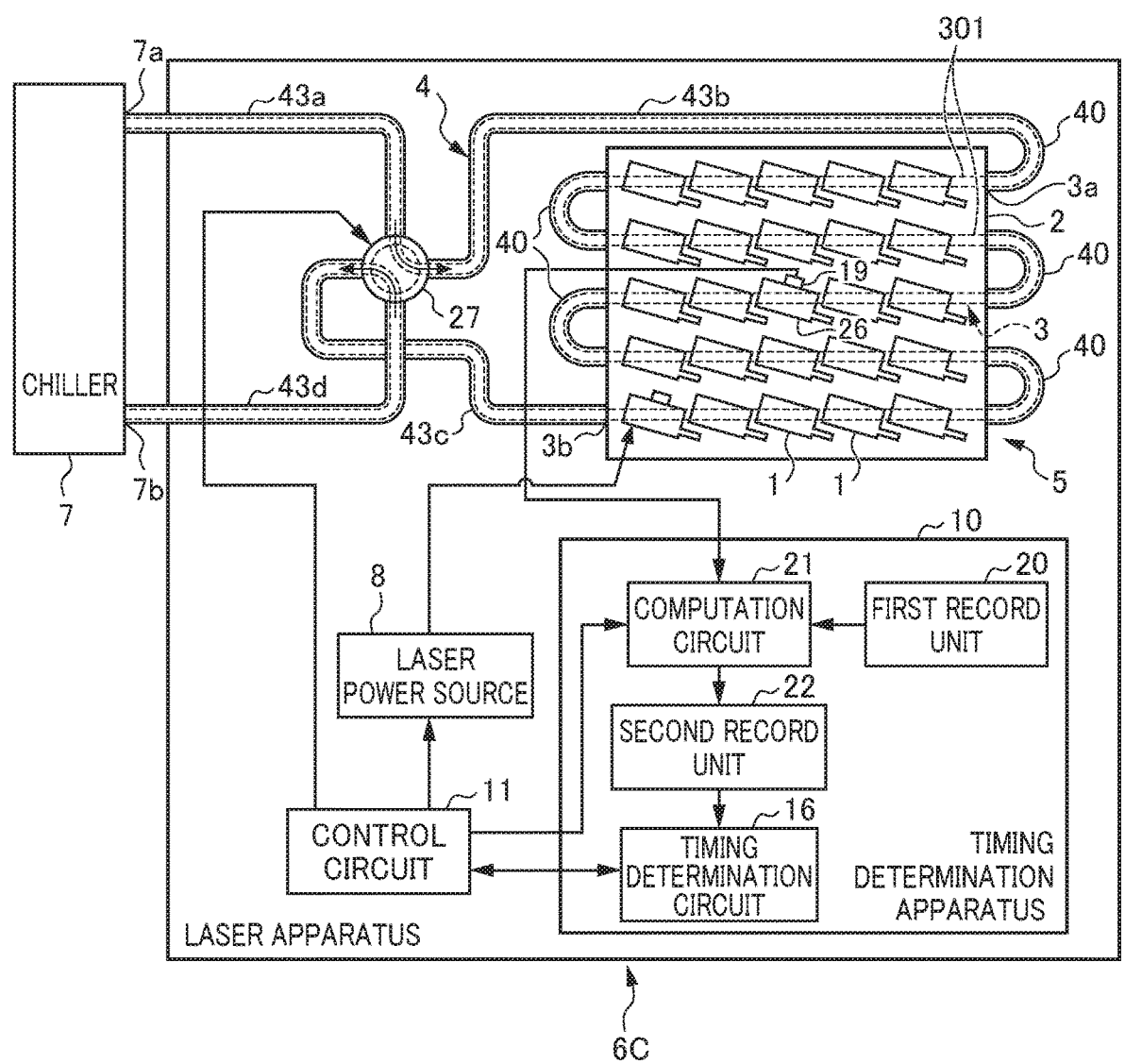
FIG. 12 is a block diagram illustrating a conceptual structure of a laser apparatus according to a third embodiment in which a portion related to cooling of the LD module is represented in a plan view illustrating a schematic structure.

FIG. 12 is a block diagram showing a conceptual structure of a laser apparatus according to a third embodiment. As in FIG. 4 of the first embodiment and FIG. 9 of the second embodiment, the LD module/cooling plate assembly 5 which is a portion related to cooling of the LD module 1 is represented in a plan view showing a schematic structure. Also, as in FIG. 4 and FIG. 9, the cooling liquid flow path 3 in the cooling plate 2 is represented by a broken line. A thick solid line arrow connecting between respective functional blocks and the like shows an output direction in communication, a supply direction of the driving current and the like. However, in order to avoid the complex diagrams, an arrow which represents the driving current supply from the laser power source 8 to the plurality of LD modules 1 only shows an arrow from the laser power source 8 to one LD module 1 which is arranged in the farthest edge, and a line or the like showing cabling between the LD modules 1 is omitted. Representation of laser optical components subsequent to these LD modules 1 are omitted, including optical fibers in each LD module 1 for extracting the laser light therefrom.

As a first point, the laser apparatus 6C of the third embodiment shown in FIG. 12 is different from that of FIG. 9 of the second embodiment in that the temperature sensor 19 is mounted only on a third LD module 26 of the plurality of LD modules 1. The third LD module 26 is an LD module which has the least change in temperature at the heat-generating part of the LD module 1 or a predetermined position of the LD module thermally connecting to the heat-generating part, providing when the flow direction of the cooling liquid is switched, the driving current is unchanged. In particular, the third LD module 26 refers to an LD module which is centrally located in the row of the LD modules 1 arranged along the cooling liquid flow path 3 as shown in FIG. 12, assuming that, in the row of the LD modules 1, the LD module 1 arranged in a position close to the most upstream side of the cooling liquid flow path and the LD module 1 arranged in a position close to the most downstream side when the cooling liquid flows therethrough in one direction are defined as both ends of the LD modules 1. In the present embodiment, as in the first embodiment and the second embodiment, as the temperature variation part, the temperature sensor 19 is mounted on a base plate portion which is close to a position where a COS in which an LD chip is mounted on the substrate is arranged, in the package of the third LD module 26.

When the time difference between the third effective cumulative driving time which is the latest effective cumulative driving time of the third LD module 26 and the effective cumulative driving time of the third LD module 26 at the last point when the flow direction of the cooling liquid was switched is defined as a second time difference, a point when the second time difference exceeds a second setting time is determined to be the timing for switching the flow direction of the cooling liquid. By this, the only LD module 1 in which the effective cumulative driving time is calculated becomes the third LD module 26. Therefore, the computational load in the computation circuit 21 can be reduced. In addition, even when the LD module 1 is driven in a different optical output or driving current condition, the variations in the end-of-life timing between the plurality of LD modules 1 can be reduced with roughly the same determination accuracy as in the second embodiment.

Further, the second setting time may also be set to a second function that the third effective cumulative driving time is defined as a second variable, as in the first setting time of FIG. 10. The second function is a function that the second variable is in a positive range and is a weakly monotonically decreasing function, and its minimum value is defined as a positive second constant. By this, the effect similar to that of the case where the first setting time is set as in FIG. 10 can be obtained.

In the laser apparatus 6C of the present embodiment, an operational flow for switching the flow direction of the cooling liquid is almost the same as the flowchart of FIG. 11. As different step, the only difference is that the temperature sensor for reading the output in Step S205 is one sensor, that the effective cumulative driving time of the only one LD module 1 (the third LD module 26) is calculated by the computation circuit 21 in Step S207, and that the determination formula is changed to the second time difference>the second setting time in Step S208.

As a second point, the laser apparatus 60 of the third embodiment shown in FIG. 12 is different from that of FIG. 9 of the second embodiment in that while the two switch valves 23a, 23b composed of a three-way valve are used in the second embodiment, one switch valve 27 composed of a four-way valve at least main part of which is made of a fluoride resin is used to reduce the number of pipe members in the present embodiment. In detail, the cooling liquid pipe 4 provided between the cooling liquid supply apparatus 7 and the cooling plate 2 is composed of a first cooling liquid pipe 43a, a second cooling liquid pipe 43b, a third cooling liquid pipe 43c and a fourth cooling liquid pipe 43d as shown in FIG. 12. The first cooling liquid pipe 43a connects between a cooling liquid outlet 7a of the cooling liquid supply apparatus 7 and the switch valve 27 so that the cooling liquid can circulate therebetween. The second cooling liquid pipe 43b connects between the switch valve 27 and the first connecting part 3a of the cooling liquid flow path 3 formed in the cooling plate 2 so that the cooling liquid can circulate therebetween. The third cooling liquid pipe 43c connects between the second connecting part 3b of the cooling liquid flow path 3 and the switch valve 27 so that the cooling liquid can circulate therebetween. The fourth cooling liquid pipe 43d connects between the switch valve 27 and the cooling liquid outlet 7b of the cooling liquid supply apparatus 7 so that the cooling liquid can circulate therebetween.

Since the switch valve 27 is composed of a four-way valve, when the switch valve 27 is in a state shown in FIG. 12, the cooling liquid flowed out of the outlet 7a of the cooling liquid supply apparatus 7 flows through, in the order of: the first cooling liquid pipe 43a; the switch valve 27; the second cooling liquid pipe 43b; the first connecting part 3a of the cooling liquid flow path 3; the cooling liquid flow path 3; the second connecting part 3b of the cooling liquid flow path 3; the third cooling liquid pipe 43c; the switch valve 27; and the fourth cooling liquid pipe 43d and flows into the inlet 7b of the cooling liquid supply apparatus 7. Further, when the core of the switch valve 27 is rotated 90° counterclockwise in FIG. 12, the cooling liquid flowed out of the outlet 7a of the cooling liquid supply apparatus 7 flows through, in the order of: the first cooling liquid pipe 43a; the switch valve 27; the third cooling liquid pipe 43c; the second connecting part 3b of the cooling liquid flow path 3; the cooling liquid flow path 3; the first connecting part 3a of the cooling liquid flow path 3; the second cooling liquid pipe 43b; the switch valve 27; and the fourth cooling liquid pipe 43d and flows into the inlet 7b of the cooling liquid supply apparatus 7. Therefore, by switch controlling the flow path of the switch valve 27, the flow direction of the cooling liquid flowing through the cooling liquid flow path 3 of the cooling plate 2 can be switched.

Meanwhile, for the switch valve 27 composed of a four-way valve, the inlet-side cooling liquid and the outlet-side cooling liquid tend to flow through the same switch valve 27. However, when the material of at least main portion of the four-way valve is made of a fluoride resin such as polychlorotrifluoroethylene which has a low heat conductivity and a high mechanical strength, the rise in temperature of the inlet-side cooling liquid due to heat exchange between the inlet-side cooling liquid and the outlet-side cooling liquid can be suppressed. The main portion in the four-way valve refers to a portion which directly comes into contact with the cooling liquid and refers to its core, for example. The case portion in which the core is contained can also be made of a fluoride resin.

Fourth Embodiment

Figure 13:
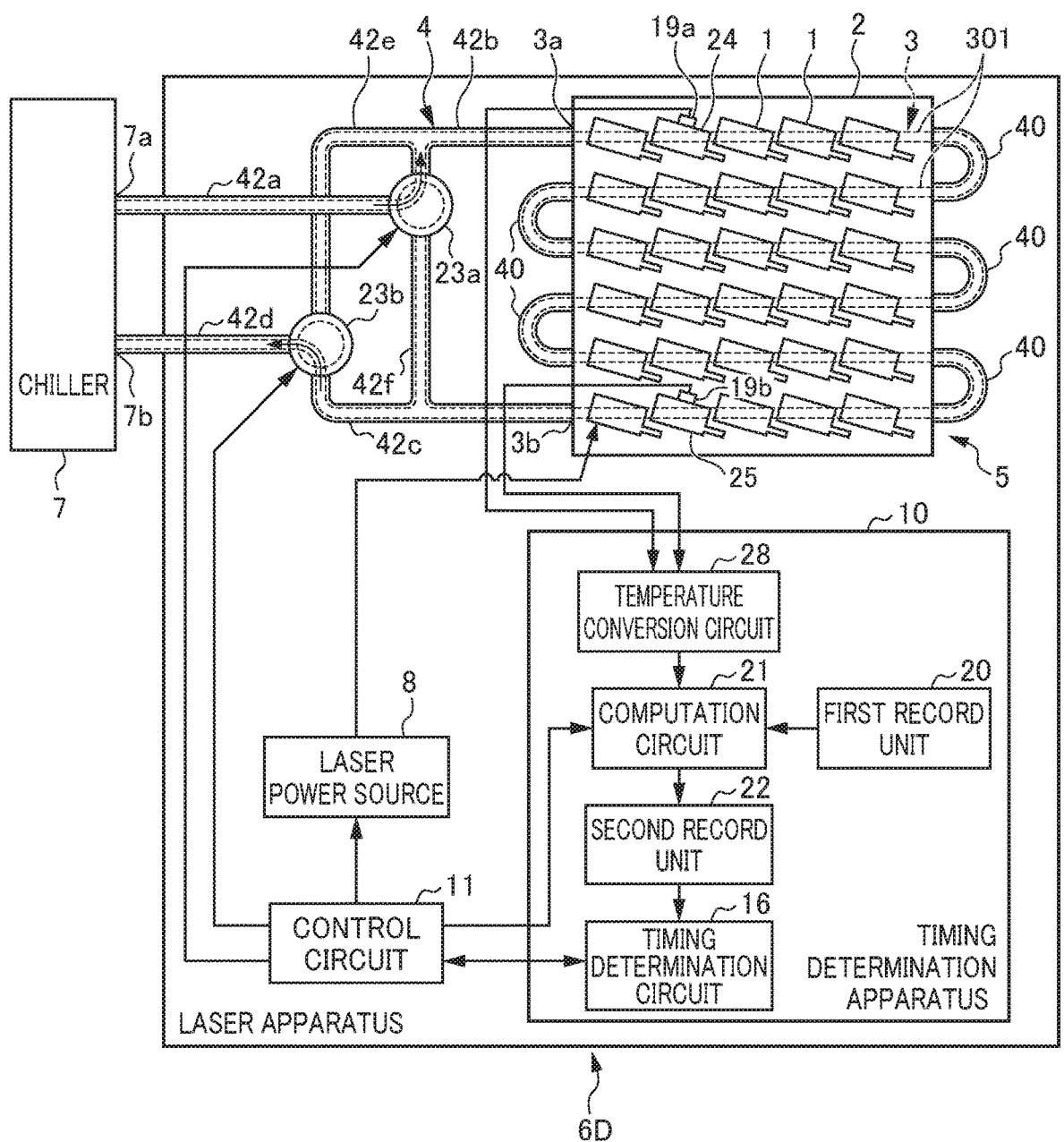
FIG. 13 is a block diagram illustrating a conceptual structure of a laser apparatus according to a fourth embodiment in which a portion related to cooling of the LD module is represented in a plan view illustrating a schematic structure.

FIG. 13 is a block diagram showing a conceptual structure of a laser apparatus according to a fourth embodiment. As in FIG. 9 of the second embodiment, an LD module/cooling plate assembly 5 which is a portion related to cooling of the LD module 2 is represented in a plan view showing a schematic structure. As in FIG. 9, the cooling liquid flow path 3 in the cooling plate 2 is represented by a broken line. A thick solid line arrow connecting between respective functional blocks and the like shows an output direction in communication, a supply direction of the driving current and the like. However, in order to avoid complex diagrams, an arrow which represents the driving current supply from the laser power source 8 to the plurality of LD modules 1 only shows an arrow from the laser power source 8 to one LD module 1 which is arranged in the farthest edge, and a line or the like showing cabling between the LD modules 1 is omitted. Also, representation of laser optical components subsequent to these LD modules 1 is omitted, including optical fibers in each LD module 1 for extracting the laser light therefrom.

The laser apparatus 6D according to the fourth embodiment shown in FIG. 13 is different from that of FIG. 9 of the second embodiment in that the output from the temperature sensors 19a, 19b is inputted to the computation circuit 21 via the temperature conversion circuit 28. In this embodiment, the temperature variation part is set to be a p-n junction of the LD which is a heat-generating part of the LD module 1. In other words, temperature time series data used for determination of timing for switching the flow direction of the cooling liquid is temperature time series data of the p-n. junction of the LD in the two LD modules (the first LD module 24 and the second LD module 25). However, it is difficult to constantly measure the temperature of the p-n junction of the LD during laser processing by the laser apparatus 6D. For this purpose, in the laser apparatus 6D, the temperature of the path node where heat generated in the LD flows through the cooling liquid 2 is measured by the temperature sensors 19a, 19b to convert the temperature time series data measured by the temperature sensors 19a, 19b into the temperature time series data of the p-n junction by the temperature conversion circuit 28 and by using a formula such as (the temperature at the p-n junction of the LD)=(the temperature measured by the temperature sensors 19a, 19b)+(the amount of heat generated at the p-n junction of the LD)×(thermal resistance from the p-n junction of the LD to the node at which the temperature is measured by the temperature sensors 19a, 19b), in the schematic thermal network of the state in which heat generated in the LD flows through the cooling plate 2.

In the above formula, the amount of heat generated at the p-n junction of the LD can be determined by subtracting the optical output per LD from the driving electric power, which is the product of the driving current supplied to the LD module 1 multiplied by the voltage applied per LD by flowing the driving current. Since thermal resistance from the p-n junction of the LD to the node at which the temperature is measured by the temperature sensors 19a, 19b is a fixed value, thermal resistance can be measured and determined beforehand by using dependency of the laser wavelength on the temperature of the p-n junction, or also can be easily estimated by thermal fluid simulation.

By defining dependency of the life consumption speed on the temperature as dependency of the life consumption speed on the temperature of the p-n junction of the LD, introduction of the impact of the temperature change on the life consumption speed at the p-n junction of the LD which is accompanied by the change in the optical output and the driving current is allowed. Because of this, for the first acceleration factor data which is recorded in the first record unit 20, recording is allowed with the data being divided into the data on the optical output acceleration factor ($k_P(P_o)$) which is an optical output acceleration factor with respect to the standard optical output of the LD module 1, and the data on the temperature acceleration factor ($k_T(T_j)$) which is a temperature acceleration factor at a heat-generating part of the LD module 1, i.e., the p-n junction of the LD in the LD module 1. Also for the second acceleration factor data, recording is similarly allowed with the data being divided into the data on the current acceleration factor ($k_I(I_d)$) which is a driving current acceleration factor with respect to the standard driving current of the LD module 1, and the data on the temperature acceleration factor ($k_T(T_j)$) which is a temperature acceleration factor at the p-n junction of the LD. Meanwhile, with respect to the temperature acceleration factor which is an acceleration factor of the temperature at the p-n junction of the LD, the same data can be commonly used for the first acceleration factor and the second acceleration factor.

The computation circuit 21 performs time integral as in the following formula by utilizing the above acceleration factor data which is recorded in the first record unit 20 with respect to the temperature time series data at the p-n junction of the LD which is outputted from the temperature conversion circuit 28, the optical output time series data of the LD module 1 which is acquired from the control circuit 11, or the driving current time series data of the LD module 1. The computation circuit 21 thereby computes the effective cumulative driving time of the first LD module 24 and the second LD module 25 to record the latest effective cumulative driving time on the second record part 22:

The effective cumulative driving time of the [Math. 2]

$$\text{first LD module} = \int_{t_s}^{t_p} \{k_P(P_o(t)) \cdot k_T(T_{j1}(t))\} dt$$

The effective cumulative driving time of the $$\text{second LD module} = \int_{t_s}^{t_p} \{k_P(P_o(t)) \cdot k_T(T_{j2}(t))\} dt$$

Or the effective cumulative driving time of the $$\text{first LD module} = \int_{t_s}^{t_p} \{k_I(I_d(t)) \cdot k_T(T_{j1}(t))\} dt$$

The effective cumulative driving time of the $$\text{second LD module} = \int_{t_s}^{t_p} \{k_I(I_d(t)) \cdot k_T(T_{j2}(t))\} dt$$

$T_{j1}$ is a temperature of the p-n junction of the LD in the first LD module 24, and $T_{j2}$ is a temperature of the p-n junction of the LD in the second LD module 25.

According to the laser apparatus 6D in this fourth embodiment, the separation into an optical output or driving current acceleration factor, and a temperature acceleration factor is allowed. As a result, in comparison with the case where acceleration factor data is recorded as a two-dimensional data table in which the optical output and the temperature are defined as variables, or a two-dimensional data table in which the driving current and the temperature are defined as variables, the amount of acceleration factor data which is necessary to be obtained by experiments or the like, and be recorded by the first record unit 20, can be greatly reduced, and the man-hours can be saved.

Among temperature acceleration factor data, the optical output acceleration factor data and the current acceleration factor data which are recorded in the first record unit 20, at least one acceleration factor data may be recorded in a mathematical equation format for calculating the acceleration factor, instead of numerical data which directly represents the acceleration factor. For example, the temperature acceleration factor can be expressed in the well-known Arrhenius reaction equation described below, and therefore the mathematical equation including an activation energy ($E_a$) and a Boltzmann constant ($k_B$=8.63×10$^{-5}$ (eV/K)) may be solely recorded in the first record unit 20. The activation energy may be determined by experiment or may use a value which has been reported in respect of the respective semiconductor devices.

The reaction speed=the constant·exp ($-E_a/k_BT$) (The Arrhenius reaction equation)

Therefore, the temperature acceleration factor =
$$\exp(-E_a/k_B T_j)/\exp(-E_a/k_B T_{js}) = \exp\{(1/T_{js} - 1/T_j) \cdot E_a/k_B\}$$

wherein $T_j$ is a temperature at the p-n junction,
$T_{js}$ is a temperature at the p-n junction when the LD module is driven for a long time until it reaches thermal equilibrium in a standard driving condition.

The optical output acceleration factor and the current acceleration factor may also be expressed as in the following mathematical equation, for example:

$$\text{Optical output acceleration factor} = (P_d/P_{os})^m$$

$$\text{Current acceleration factor} = \{(I_d - I_{th})/(I_{ds} - I_{th})\}^n,$$

wherein $P_{os}$ is an optical output when the LD module 1 is driven in a standard driving condition, namely a standard optical output, $I_{ds}$ is a driving current when the LD module 1 is driven in a standard driving condition, namely a standard driving current. $I_{th}$ is a threshold current of the LD. m and n are constants.

Thus, by recording the acceleration factor data as the mathematical equation format data, instead of the numerical data, calculation of the effective cumulative driving time is allowed with less data, and the man-hours spent for data acquisition can be further reduced.

Figure 14:
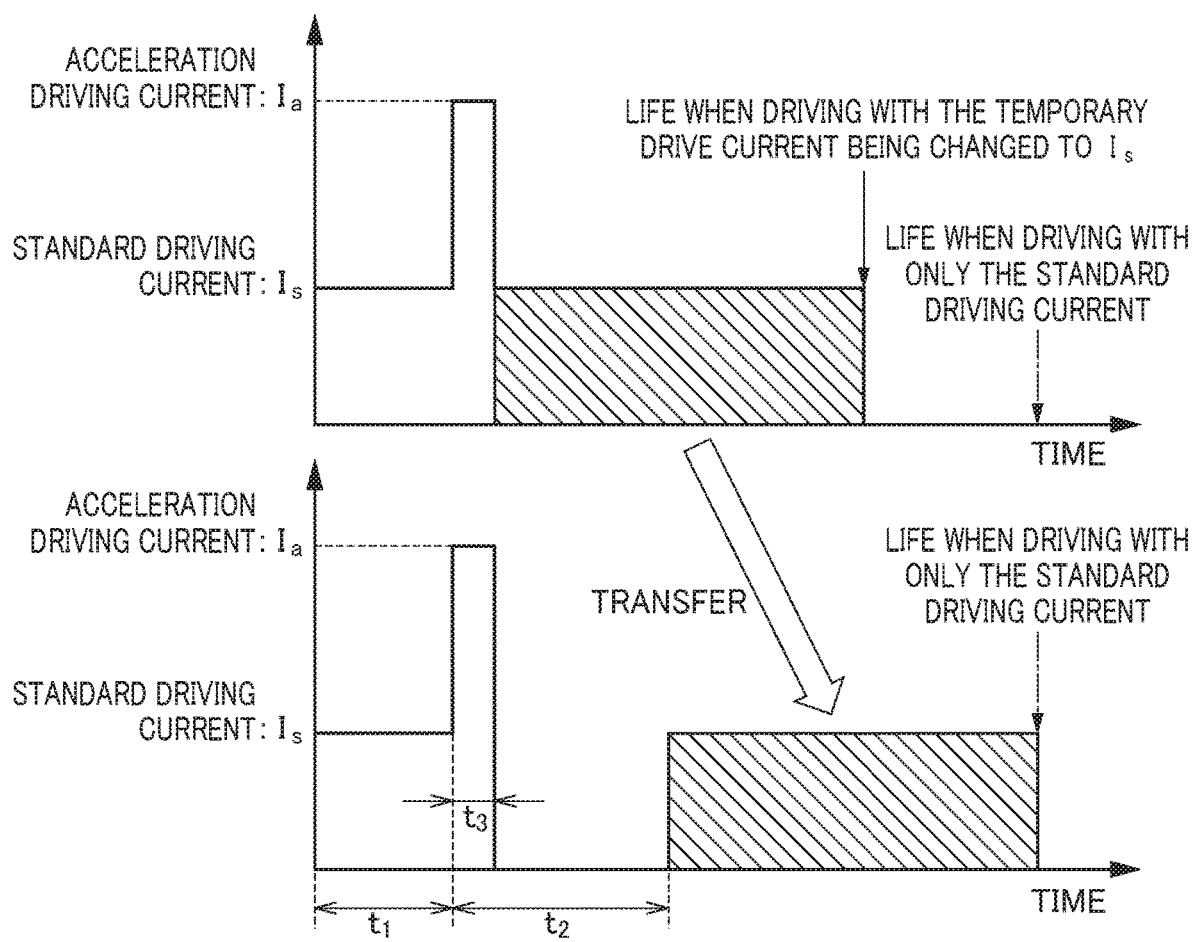
FIG. 14 is a diagram illustrating a method for experimentally determining dependency of a current acceleration factor on the effective cumulative driving time.

The output acceleration factor data or the current acceleration factor data may be recorded in the first record unit 20 as data dependent on the effective cumulative driving time. For example, in order to obtain dependency data of the current acceleration factor on the effective cumulative driving time, the change in life may be studied, by experiment, by driving the LD module 1 with a certain driving current which is different from the standard driving current only for a predetermined period of time in the entire life of the LD module 1 as shown in FIG. 14. When the result as in FIG. 14 is obtained, the acceleration driving current acceleration factor in the effective cumulative driving time $t_1 + t_2/2$ can be determined by correcting from $t_2/t_3$ by the increment of the temperature rise of the p-n junction, resulting from the increase in the driving current. In order to shorten the time necessary to obtain dependency data of the acceleration factor on the effective cumulative driving time, it is desirable that the temperature of the p-n junction of the LD, including during driving with the standard driving current, is increased more than the temperature of the p-n junction of the LD when it is driven in the standard driving condition, to conduct the experiment. Also, in the case where dependency data of the optical output acceleration factor on the effective cumulative driving time is acquired, the similar method as above can be applied.

The output acceleration factor or the current acceleration factor which takes dependency on the effective cumulative driving time can be given by the following formula:

$$\text{Optical output acceleration factor} = ((P_d/P_{os})\wedge(m + at_{ec})$$

$$\text{Current acceleration factor} = \{(I_d - I_{th})/(I_{ds} - I_{th})\}\wedge(n + bt_{ec}),$$

wherein $t_{ec}$ is the effective cumulative driving time, a and b are coefficient (constant).

Thus, by taking dependency of the output acceleration factor or the current acceleration factor on the effective cumulative driving time into account, in a condition where the optical output is greater than the standard optical output (namely, the condition of the optical output acceleration factor>1), or in a condition where the driving current is greater than the standard driving current (namely, the condition of the current acceleration factor>1) the calculation of the effective cumulative driving time is allowed with greater precision even when the optical output acceleration factor and the current acceleration factor tend to gradually increase when the LD module reaches the later life.

Fifth Embodiment

Figure 15:
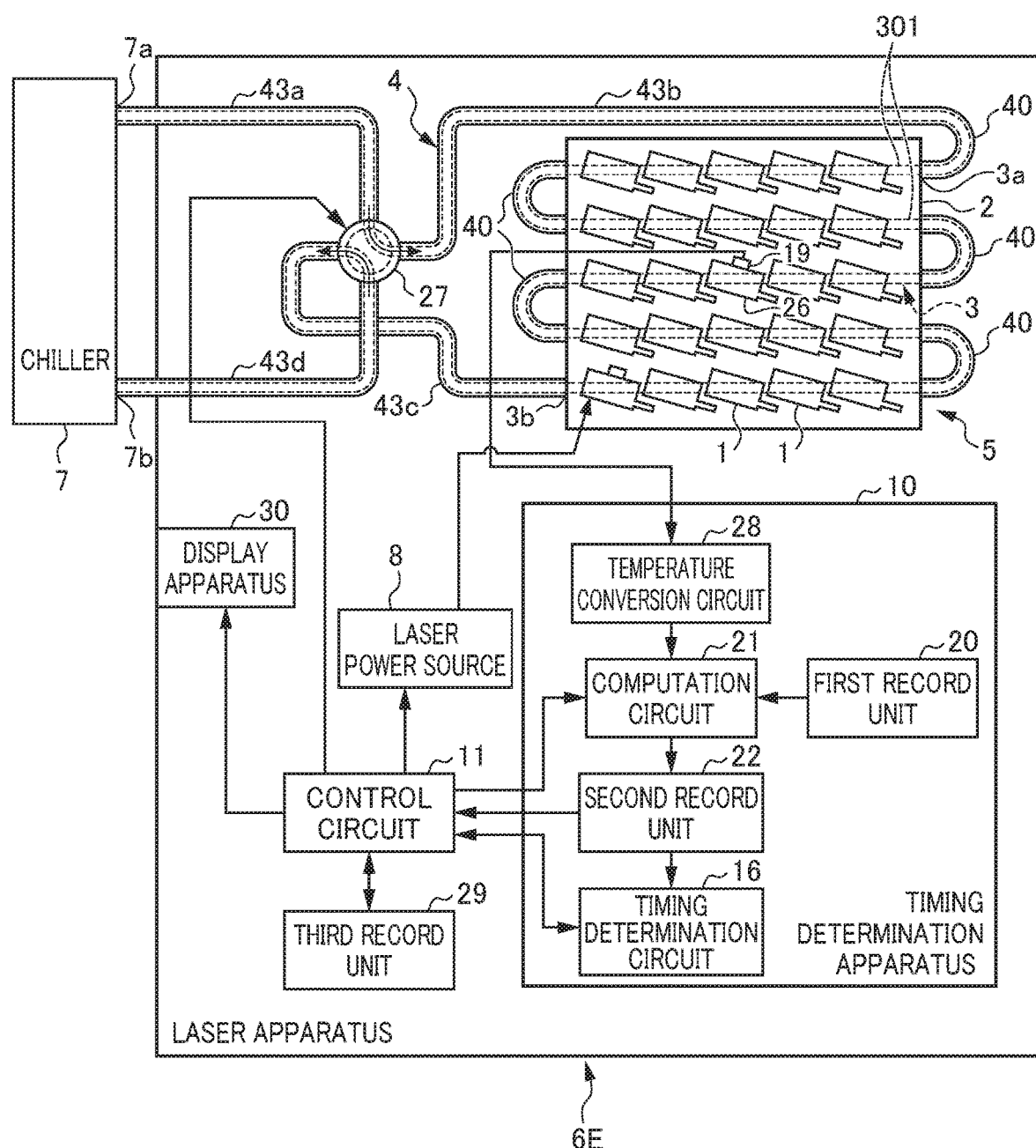
FIG. 15 is a block diagram illustrating a conceptual structure of a laser apparatus according to a fifth embodiment in which a portion related to cooling of the LD module is represented in a plan view illustrating a schematic structure.

FIG. 15 is a block diagram showing a conceptual structure of a laser apparatus according to a fifth embodiment. The LD module cooling plate assembly 5 which is analogous to FIG. 12 of the third embodiment, and which is a portion related to cooling of the LD module 1 as in FIG. 12 is represented in a plan view showing a schematic structure. As in FIG. 12, the cooling liquid flow path 3 in the cooling plate 2 is represented by a broken line. A thick solid line arrow connecting between respective functional blocks and the like shows an output direction in communication, a supply direction of the driving current and the like. However, in order to avoid the complex diagram, an arrow which represents the driving current supply from the laser power source 8 to the plurality of LD modules 1 only shows an arrow from the laser power source 8 to one LD module 1 which is arranged in the farthest edge, and a line or the like showing cabling between the LD modules 1 is omitted. Also, representation of laser optical components subsequent to these LD modules 1 are omitted, including optical fibers in each LD module 1 for extracting the laser light therefrom.

The laser apparatus 6E according to the fifth embodiment shown in FIG. 15 is different from that of the third embodiment in FIG. 12 in that, as in the fourth embodiment, it also comprises the temperature conversion circuit 28 and further comprises a third record unit 29 and a display apparatus 30. The temperature conversion circuit 28 is, as in the fourth embodiment, for converting the temperature measured by the temperature sensor 19 into the temperature of the p-n junction of the LD of the third LD module 26. Although the description is omitted, when the temperature time series data for determining the timing for switching the flow direction of the cooling liquid is defined as the temperature time series data at the p-n junction of the LD, the acceleration factor data required on calculation of the effective cumulative driving time can be greatly reduced as mentioned above.

The laser apparatus 6E of the present embodiment measures, by a command from the control circuit 11, the optical output property of the laser oscillator in which the plurality of LD modules 1 is used as a light emitting source or an excitation light source in a predetermined driving condition and along a predetermined schedule. The laser apparatus 6E associates the history of the measured result for the optical output property with the effective cumulative driving time which is recorded in the first record unit 20 and records it in the third record unit 29.

The control circuit 11, by using the measured result for the optical output property associated with the effective cumulative driving time which is recorded in the third record unit 29, outputs to the display apparatus 30, at least any one of: dependency of an actual optical output or an actual driving current on the effective cumulative driving time; the degradation width or the degradation rate of the actual optical output or the actual driving current between an optical output property measured point and the previous optical output property measured point; and the degradation speed in which the degradation width is divided by the difference of the effective cumulative driving time between the both points, the actual optical output being an optical output outputted by a predetermined driving current derived from the optical output property, and the actual driving current being a driving current necessary to obtain a predetermined optical output. Thus, the display apparatus 30 displays dependency of the actual optical output or the actual driving current on the effective cumulative driving time, the degradation width or the degradation rate of the actual optical output or the actual driving current, and the degradation speed.

Figure 16:
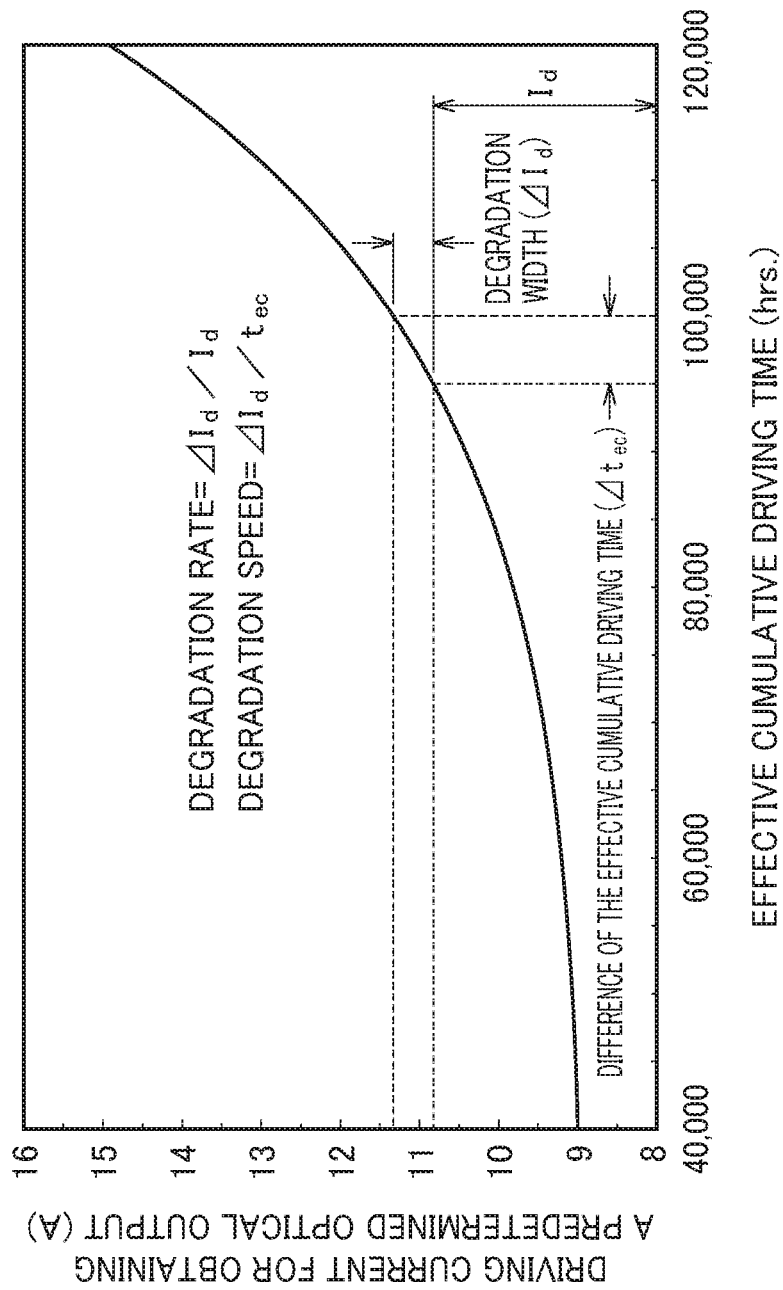
FIG. 16 is a graph illustrating dependency of the driving current necessary to obtain a predetermined optical output on the effective cumulative driving time, and a diagram exemplifying the degradation width, degradation rate, and degradation speed in the driving current necessary to obtain a predetermined optical output.

FIG. 16 illustrates a graph showing dependency of the actual driving current on the effective cumulative driving time. In the drawing, the degradation width is shown and formulas representing the degradation rate and the degradation speed are described. By displaying dependency of the actual optical output or the actual driving current on the effective cumulative driving time, the degradation width or the degradation rate of the actual optical output or the actual driving current, and the degradation speed to the display apparatus 30, a user or manager of the laser apparatus 6E can grasp the degradation status and the remaining life of the plurality of the LD modules 1 (an LD module unit) as a whole, and can systematically perform preparation for an LD module unit for replacement and maintenance operation. Thus, the downtime of the laser apparatus 6E can be minimized. The display apparatus 30 can also be configured to display the effective cumulative driving time.

Sixth Embodiment

Figure 17:
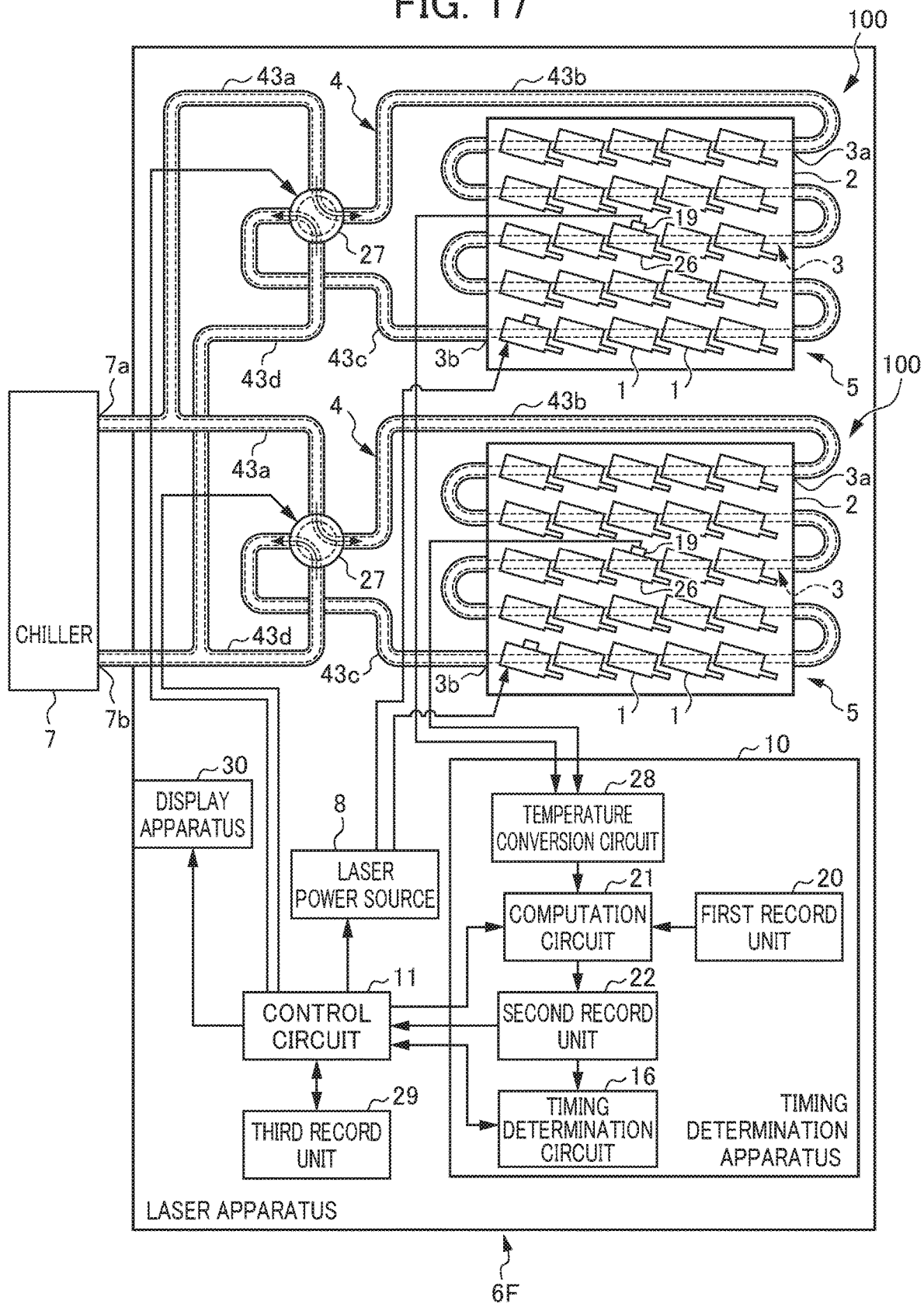
FIG. 17 is a block diagram illustrating a conceptual structure of a laser apparatus according to a sixth embodiment in which a portion related to cooling of the LD module is represented in a plan view illustrating a schematic structure.

FIG. 17 is a block diagram showing a conceptual structure of a laser apparatus according to a sixth embodiment. As in the block diagrams showing a conceptual structure of a laser apparatus according to other embodiments, an LD module/cooling plate assembly 5 which is a portion related to cooling of the LD module 1 is represented in a plan view illustrating a schematic structure. The cooling liquid flow path 3 in the cooling plate 2 is shown by a broken line. A thick solid line arrow connecting between respective functional blocks and the like shows an output direction in communication, a supply direction of the driving current and the like. However, in order to avoid the complex diagram, an arrow which represents the driving current supply from the laser power source 8 to the plurality of LD modules 1 only shows an arrow from the laser power source 8 to the LD modules 1, 1 which are arranged in the farthest edge, and a line or the like showing cabling between the LD modules 1 is omitted. Representation of laser optical components subsequent to these LD modules 1 are omitted, including optical fibers in each LD module 1 for extracting the laser light therefrom.

A laser apparatus 6F of the present embodiment is a laser apparatus in which two LD module groups 100, 100 composed of a plurality of LD modules 1 to which the driving current is supplied in series are present, and to each of which the driving current can be independently supplied. For the control circuit 11 of the present embodiment, in order to output a predetermined optical output command, a driving current outputting command is outputted so that the driving current is allocated preferentially to an LD module group 100 having relatively shorter effective cumulative driving time or an LD module group 100 having a relatively smaller deterioration speed among the plurality of LD module groups 100, 100 when the driving current outputting command with respect to respective LD module groups 100, 100 is outputted to the laser power source 8.

In the present embodiment, the cooling liquid pipe 4 provided between the one cooling liquid supply apparatus 7 and the two cooling plates 2, 2 comprises the same structure as the cooling liquid pipe 4 in the laser apparatus 6C shown in FIG. 12, in the respective cooling plates 2, 2. A cooling liquid pipe 43a connected to the cooling liquid outlet 7a of the cooling liquid supply apparatus 7 is branched into two in the middle toward respective switch valves 27, 27. Cooling liquid pipes 43d, 43d connected to respective switch valves 27, 27 are assembled into one in the middle and connected to the cooling liquid inlet 7b of the cooling liquid supply apparatus 7.

In the timing determination apparatus 10 of the present embodiment, the timing for switching the flow direction of the cooling liquid which flows through the cooling liquid flow path 3 of the cooling plate 2 may be independently determined for the respective LD module groups 100, 100, i.e., the respective LD module/cooling plate assemblies 5, 5. The actual time for switching a flow of the cooling liquid may be set differently by the respective LD module/cooling plate assemblies 5, 5. A flow meter and a flow rate control valve, which are not shown, may be mounted in the middle of each branched cooling liquid pipe 4 to make the flow rate of the cooling liquid flowing through the cooling liquid flow paths 3, 3 of the respective cooling plates 2, 2 uniform.

In the laser apparatus 6F of the present embodiment, with respect to a predetermined optical output command, life consumption for an LD module group 100 having relatively longer effective cumulative driving time or an LD module group 100 having a relatively larger characteristic deterioration can be suppressed by preferentially allocating the driving current to an LD module group 100 having relatively shorter effective cumulative driving time or an LD module group 100 having a relatively smaller characteristic deterioration among the LD module groups 100, 100. Thus, the timing for exchanging their respective LD module groups 100, 100 can make uniform. This can reduce a count of maintenance and maintenance cost for the laser apparatus 6F. The LD module group 100 composed of the plurality of LD modules 1 to which the driving current is supplied in series is not limited to the two groups as in FIG. 17, and may be three groups or more.

Seventh Embodiment

Figure 18:
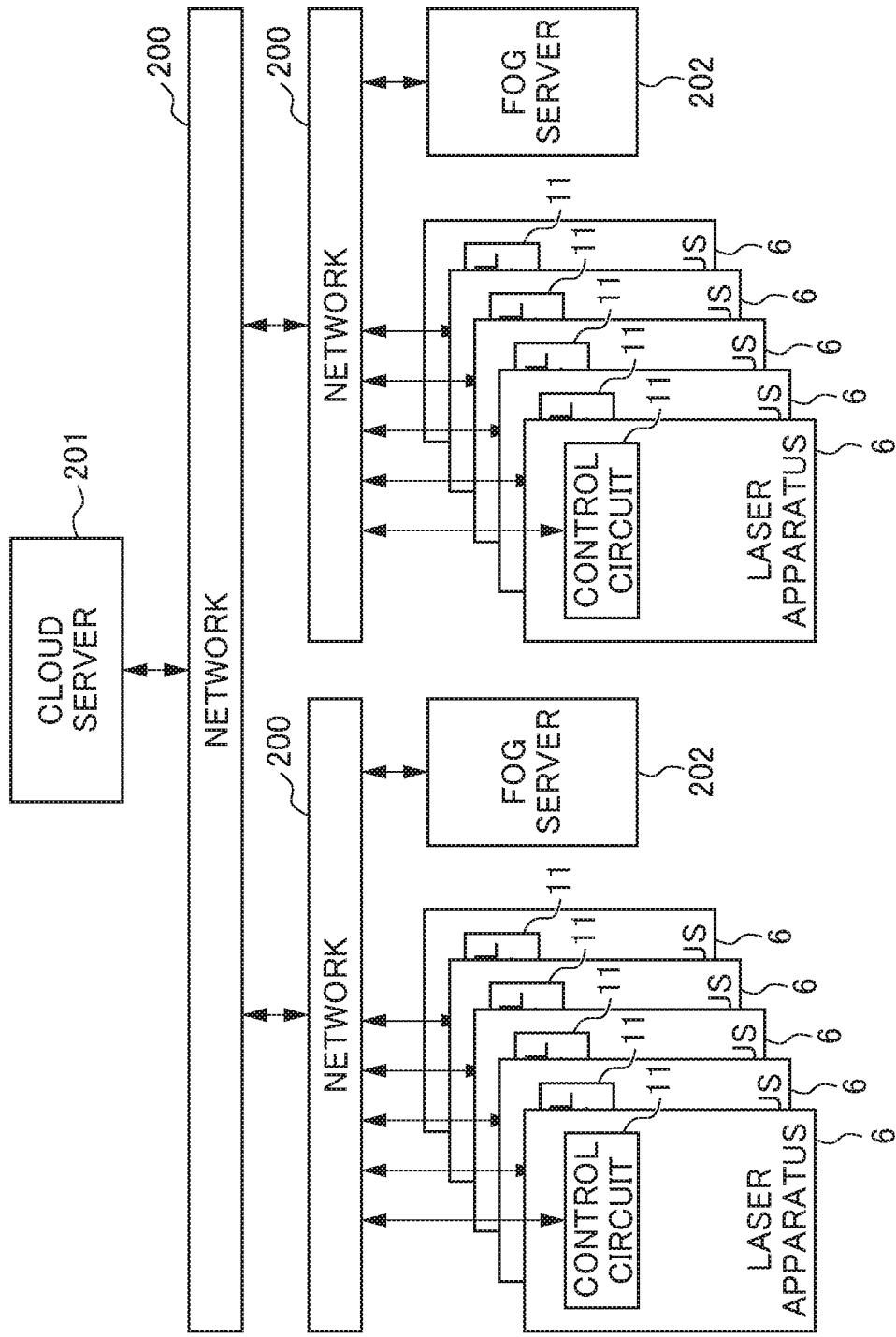
FIG. 18 is a block diagram illustrating a conceptual structure of a laser apparatus according to a seventh embodiment.

FIG. 18 is a block diagram showing a conceptual structure of a laser apparatus according to a seventh embodiment. For the laser apparatus 6, either the laser apparatuses 6E or 6F comprising the third record part 29 can be used among the laser apparatus 6 described above. In each laser apparatus 6, representation of functional blocks and the like, other than the control circuits 11, is omitted. Representation of a cooling liquid supply apparatus is also omitted. In the laser apparatus 6 of the present embodiment, the control circuit 11 outputs at least any one of: the effective cumulative driving time; dependency of an actual optical output or an actual driving current on the effective cumulative driving time; and the deterioration speed via a network 200 to a cloud server 201 or a fog server 202.

In the laser apparatus 6 of the present embodiment, in each LD module group in which the supply of the driving current is independently controllable, the driving status, the deterioration status and the remaining life can be collectively managed by the cloud server 201 or the fog server 202. Therefore, designed maintenance is allowed and the downtime of the laser apparatus 6 due to the replacement and maintenance operation of the LD module 1 can be reduced.

In the examples of the above respective embodiments or variations, any of the control circuit 11, the first timer control circuit 14, the second timer control circuit 15, the timing determination circuit 16, the computation circuit 21 and the temperature conversion circuit 28 are mainly configured around a microcomputer having CPU, ROM, RAM and the like. The CPU performs arithmetic processing related to functions required to each circuit. Although these circuits are described as if they are separated by their functions, one CPU may be configured to perform an operation required to the plurality of circuits, or one CPU may be configured to perform operation processing related to functions required to the above all circuits. In addition, these circuits may be configured by FPGA (Field Programmable Gate Dispos).

In the above described respective embodiments or variation examples, while the first record unit 20, the second record unit 22 and the third record unit 29 are also described as functionally separated blocks, one memory such as a ROM may perform a function for the plurality of record units 20, 22, 29, or one memory may perform the function for all the above-described record units 20, 22, 29.

In the above respective embodiments or variation examples, the cooling liquid supply apparatus 7 is not limited to the circular cooling liquid supply apparatus, and the cooling liquid may also be supplied from the factory pipe to the laser apparatus 6 (6A-6F). The cooling liquid may be, at least, chilled water whose main component is water, or a coolant and the like.

In the above respective embodiments or variation examples, although the term of the cooling liquid flow path 3 of the cooling plate and the term of the cooling liquid pipe 4 are used separately, they are not limited to the structures which are separated from each other. For example, their structure may be such that a copper pipe is sandwiched between two aluminum alloy plates having a groove formed therein. In this instance, the two aluminum alloys are the cooling plates 2, the inside of the copper pipe which is sandwiched between two aluminum alloys is referred to as the cooling liquid flow path 3, and the portion of the copper pipe which is not sandwiched between two aluminum alloys is referred to as the cooling liquid pipe 4.

The arrangement of the cooling liquid pipe 4 having the switch valves 9a-9d made up of a two-way valve in the laser apparatus 6A may also applied to the arrangement of the cooling liquid pipe 4 in the laser apparatuses 6B-6F. Further, the arrangement of the cooling liquid pipe 4 having the switch valves 23a, 23b made up of a three-way valve in the laser apparatuses 6B, 6D may also applied to the arrangement of the cooling liquid pipe 4 in the laser apparatuses 6A, 6C, 6E, 6F. The arrangement of the cooling liquid pipe 4 having the switch valve 27 made up of a four-way valve in the laser apparatuses 6C, 6E, 6F may also be applied to the arrangement of the cooling liquid pipe 4 in the laser apparatuses 6A, 6B, 6D.

All the examples and specific terms cited herein are intended to help readers to understand the concepts given by the present inventor, for facilitating the present invention and the technique with the aim of teaching, and these should not be construed as limitation to any example configurations, the specifically cited examples and conditions herein regarding matters showing superiority and inferiority of the present invention. Although the embodiments of the present invention are described in detail, various alterations, replacements and modifications can be added thereto without departing from the spirit and scope of the present invention.

EXPLANATION OF REFERENCE NUMERALS

1 LD module
2 Cooling plate
3 Cooling liquid flow path
4 Cooling liquid pipe
5 LD module/cooling plate assembly
6, 6A-6F Laser apparatus
6 Cooling liquid supply apparatus
8 Laser power source
9a-9d, 23a, 23b, 27 Switch valves
10 Timing determination apparatus
11 Control circuit
16 Timing determination circuit
20 First record unit
21 Computation circuit
22 Second record unit
24 First LD module
25 Second LD module
26 Third LD module
28 Temperature conversion circuit
29 Third record unit
30 Display apparatus
100 LD module group
200 Network
201 Cloud server
202 Fog server

What is claimed is:

1. A laser apparatus comprising a laser diode module/cooling plate assembly in which a plurality of laser diode modules to which a driving current is supplied in series is disposed on a surface of a cooling plate which is cooled by flowing a cooling liquid supplied from a cooling liquid supply apparatus through a cooling liquid flow path formed therein, with the plurality of laser diode modules thermally connected to the cooling plate, comprising:

a laser power source for supplying the driving current to the plurality of laser diode modules;

switch valves for switching the flow direction of the cooling liquid flowing through the cooling liquid flow path, which are provided in a cooling liquid pipe connecting to the cooling liquid flow path;

a timing determination apparatus for determining the timing for switching the flow direction of the cooling liquid flowing through the cooling liquid flow path, by referencing temperature time series data of at least any one temperature variation part in the laser diode module/cooling plate assembly having temperature variations due to heat generated in a heat-generating part of the laser diode module composing the plurality of laser diode modules; and a control circuit for outputting a driving current output command to the laser power source and outputting a valve switch command to the switch valves to switch the flow direction of the cooling liquid flowing through the cooling liquid flow path by referencing the determination result of the timing determination apparatus.

2. The laser apparatus according to claim 1, wherein the timing determination apparatus comprises:

a first record unit for recording at least one acceleration factor data of first acceleration factor data which is an acceleration factor which depends on the optical output and the temperature of the temperature variation part of the laser diode module and second acceleration factor data which is an acceleration factor which depends on the driving current and the temperature of the temperature variation part of the laser diode module, the acceleration factors, on the basis of the life consumption speed when the laser diode module is driven in a standard driving condition, being a life consumption acceleration factor which represents a ratio of a life consumption speed when the laser diode module is driven in a driving condition which is different from the standard driving condition;

a computation circuit for computing an effective cumulative driving time by referencing at least one time series data of optical output time series data of the laser diode module and driving current time series data of the laser diode module in addition to the temperature time series data of the temperature variation part, and performing time integral of the acceleration factor read from the first record unit, from the first driving start point of the laser diode module to the latest point; and a second record unit for recording the computed effective cumulative driving time on at least one laser diode module among the plurality of laser diode modules, the timing determination apparatus determining the timing for switching the flow direction of the cooling liquid based on the effective cumulative driving time recorded in the second record unit.

3. The laser apparatus according to claim 2, wherein at least one of the temperature variation parts is a p-n junction of a laser diode which is a heat-generating part of at least one laser diode module of the plurality of laser diode modules, at least one of the temperature time series data is the temperature time series data of the p-n junction of the laser diode, at least one acceleration factor data of the first acceleration factor data and the second acceleration factor data recorded in the first record unit is respectively recorded as, optical output acceleration factor data which is an optical output acceleration factor with respect to a standard optical output of the laser diode module, and temperature acceleration factor data which is a temperature acceleration factor of the heat-generating part of the laser diode module, and current acceleration factor data which is a driving current acceleration factor with respect to a standard driving current of the laser diode module and the temperature acceleration factor data which is a temperature acceleration. factor of the heat-generating part of the laser diode module, the computation circuit computing the effective cumulative driving time by performing time integral of the product of the optical output acceleration factor and the temperature acceleration factor or of the product of the current acceleration factor and the temperature acceleration factor, from the first driving start point of the laser diode module to the latest point.

4. The laser apparatus according to claim 3, wherein at least one acceleration factor data of the temperature acceleration factor data, the optical output acceleration factor data and the current acceleration factor data which are recorded in the first record unit is recorded in a mathematical equation format for calculating an acceleration factor, instead of the numerical data which directly represents the acceleration factor.

5. The laser apparatus according to claim 4, wherein at least one acceleration factor data of the optical output acceleration factor data and the current acceleration factor data is recorded in the first record unit as data dependent on the effective cumulative driving time.

6. The laser apparatus according to claim 5, wherein the optical output acceleration factor data or the current acceleration factor which depends on the effective cumulative driving time is respectively optical output acceleration factor data or current acceleration factor data which is determined by an acceleration factor deriving apparatus or an acceleration factor deriving method for deriving the optical output acceleration factor or the current acceleration factor which depends on the effective cumulative driving time by driving the laser diode module with a certain optical output different from the standard optical output included in the standard driving condition only for a predetermined certain period in the whole life of the laser diode module or by driving the laser diode module with a certain driving current different from the standard driving current included in the standard driving condition only for a predetermined certain period in the whole life of the laser diode module.

7. The laser apparatus according to claim 2, wherein the timing determination apparatus determines, as the timing for switching the flow direction of the cooling liquid, a point when a first time difference which is the time difference between a first effective cumulative driving time which is the effective cumulative driving time of a first laser diode module of the plurality of the laser diode modules and a second effective cumulative driving time which is the effective cumulative driving time of a second laser diode module of the plurality of the laser diode modules, exceeds a first setting time.

8. The laser apparatus according to claim 7, wherein the first setting time is a first function in which any of the first effective cumulative driving time, the second effective cumulative driving time, and the sum of the first effective cumulative driving time and the second effective cumulative driving time is defined as a first variable, the first function being a function that the first variable is in a positive range and is a weakly monotonically decreasing function, and its minimum value is defined as a positive first constant.

9. The laser apparatus according to claim 2, wherein assuming that among the plurality of the laser diode modules, a laser diode module having the least temperature change at the heat-generating part of the laser diode modules or a predetermined position of the laser diode modules thermally connected to the heat-generating part is defined as a third laser diode module, providing when the flow direction of the cooling liquid is switched, the driving current is unchanged, the timing determination apparatus determines, as the timing for switching the flow direction of the cooling liquid, a point when a second time difference which is the time difference between a third effective cumulative driving time which is the latest effective cumulative driving time of the third laser diode module and the effective cumulative driving time of the third laser diode module at the last point when the flow direction of the cooling liquid was switched, exceeds a second setting time.

10. The laser apparatus according to claim 9, wherein the second setting time is a second function that the third effective cumulative driving time is defined as a second variable, the second function being a function that the second variable is in a positive range and is a weakly monotonically decreasing function, and its minimum value is defined as a positive second constant.

11. The laser apparatus according to claim 2, wherein the laser apparatus measures, by a command from the control circuit, the optical output property of a laser oscillator in which the plurality of laser diode modules is used as a light emitting source or an excitation light source in a predetermined driving condition and along a predetermined schedule, and comprises a third record unit which associates the history of the measured result for the optical output property with the effective cumulative driving time which is recorded in the first record unit and records it, and the control circuit, by using the measured result for the optical output property associated with the effective cumulative driving time which is recorded in the third record unit, is able to output at least any one of: dependency of an actual optical output or an actual driving current on the effective cumulative driving time; a degradation width or a degradation rate of an actual optical output or an actual driving current between a certain optical output property measured point and a previous optical output property measured point; and a degradation speed in which the degradation width is divided by the difference of the effective cumulative driving time between the both points, the actual optical output being an optical output outputted by a predetermined driving current derived from the optical output property, and the actual driving current being a driving current necessary to obtain a predetermined optical output.

12. The laser apparatus according to claim 11, wherein the laser apparatus is a laser apparatus in which a plurality of laser diode module groups composed of a plurality of laser diode modules to which the driving current is supplied in series is present, the driving current, can be supplied to each laser diode module group independently, and the control circuit, in order to output a predetermined optical output command, outputs a driving current outputting command so that the driving current is allocated preferentially to a laser diode module group having the relatively shorter effective cumulative driving time or a laser diode module group having the relatively smaller deterioration speed among the plurality of laser diode module groups when the driving current outputting command for each laser diode module group is outputted to the laser power source.

13. The laser apparatus according to claim 11, wherein the control circuit outputs at least any one of: the effective cumulative driving time; dependency of the actual optical output or the actual driving current on the effective cumulative driving time; and the deterioration speed via a network to a cloud server or a fog server.

14. The laser apparatus according to claim 1, wherein the switch valve is composed of three-way valves produced by a set of two: one inlet-side three-way valve in which three cooling liquid pipes for flowing the cooling liquid supplied from the cooling liquid supply apparatus to the cooling liquid flow path are connected; and one outlet-side three-way valve in which three cooling liquid pipes for flowing the cooling liquid flowed out of the cooling liquid flow path are connected.

15. The laser apparatus according to claim 1, wherein the switch valve is a four-way calve in which four cooling liquid pipes are connected, at least a main part of which is made of a fluoride resin, and by which the flow direction of the cooling liquid flowing through the cooling liquid flow path is changed.

* * * * *